(12) United States Patent
Matsubara

(10) Patent No.: US 11,508,458 B2
(45) Date of Patent: *Nov. 22, 2022

(54) ACCESS SCHEMES FOR ACCESS LINE FAULTS IN A MEMORY DEVICE

(71) Applicant: Micron Technology, Inc., Boise, ID (US)

(72) Inventor: Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/150,902

(22) Filed: Jan. 15, 2021

(65) Prior Publication Data
US 2021/0210158 A1 Jul. 8, 2021

Related U.S. Application Data

(63) Continuation of application No. 16/102,489, filed on Aug. 13, 2018, now Pat. No. 10,902,935.

(51) Int. Cl.
*G11C 29/00* (2006.01)
*G06F 11/10* (2006.01)

(52) U.S. Cl.
CPC ........ *G11C 29/832* (2013.01); *G06F 11/1016* (2013.01)

(58) Field of Classification Search
None
See application file for complete search history.

(56) References Cited

U.S. PATENT DOCUMENTS

| | | | | |
|---|---|---|---|---|
| 6,038,191 A * | 3/2000 | Fukuhara | ............... | G11C 29/83 257/E27.097 |
| 6,049,495 A | 4/2000 | Hsu et al. | | |
| 7,142,446 B2 | 11/2006 | Derner et al. | | |
| 7,729,190 B2 | 6/2010 | Xi | | |
| 10,902,935 B2 * | 1/2021 | Matsubara | .......... | G06F 11/1016 |
| 2004/0153843 A1 * | 8/2004 | Kaiser | ...................... | G11C 8/00 714/42 |
| 2006/0245283 A1 * | 11/2006 | Vogelsang | ............ | G11C 7/065 365/205 |
| 2009/0261792 A1 | 10/2009 | Kim et al. | | |
| 2013/0322186 A1 | 12/2013 | Lee | | |
| 2016/0064056 A1 * | 3/2016 | Kim | .................... | G11C 11/4085 365/189.11 |

\* cited by examiner

*Primary Examiner* — J. H. Hur
(74) *Attorney, Agent, or Firm* — Holland & Hart LLP

(57) ABSTRACT

Methods, systems, and devices related to access schemes for access line faults in a memory device are described. In one example, a method may include isolating a first word line of a section of a memory device from a voltage source (e.g., a deselection voltage source) during a first portion of a period when the first word line is deselected, and coupling the first word line with the voltage source during a second portion of the period when the first word line is deselected based on determining that an access operation is performed during the second portion of the period when the word line is deselected. In some examples, the method may include identifying that the first word line is associated with a fault, such as a short circuit fault with a digit line of the memory device.

20 Claims, 15 Drawing Sheets

ACCESS SCHEMES FOR ACCESS LINE FAULTS IN A MEMORY DEVICE

CROSS REFERENCE

The present Application for Patent is a continuation of U.S. patent application Ser. No. 16/102,489, by Matsubara, entitled "ACCESS SCHEMES FOR ACCESS LINE FAULTS IN A MEMORY DEVICE," filed Aug. 13, 2018, assigned to the assignee hereof, and is expressly incorporated by reference in its entirety herein.

BACKGROUND

The following relates generally to memory systems and more specifically to access schemes for access line faults in a memory device.

Memory devices are widely used to store information in various electronic devices such as computers, wireless communication devices, cameras, digital displays, and the like. Information is stored by programing different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improving memory devices, may include increasing memory cell density, increasing read/write speeds, increasing reliability, increasing data retention, reducing power consumption, or reducing manufacturing costs, among other metrics. In some cases, access line faults or defects may cause errors in access operations, and mitigating such errors may be associated with unnecessary power consumption, further access operation errors, or other disadvantages.

DETAILED DESCRIPTION

Figure 1:
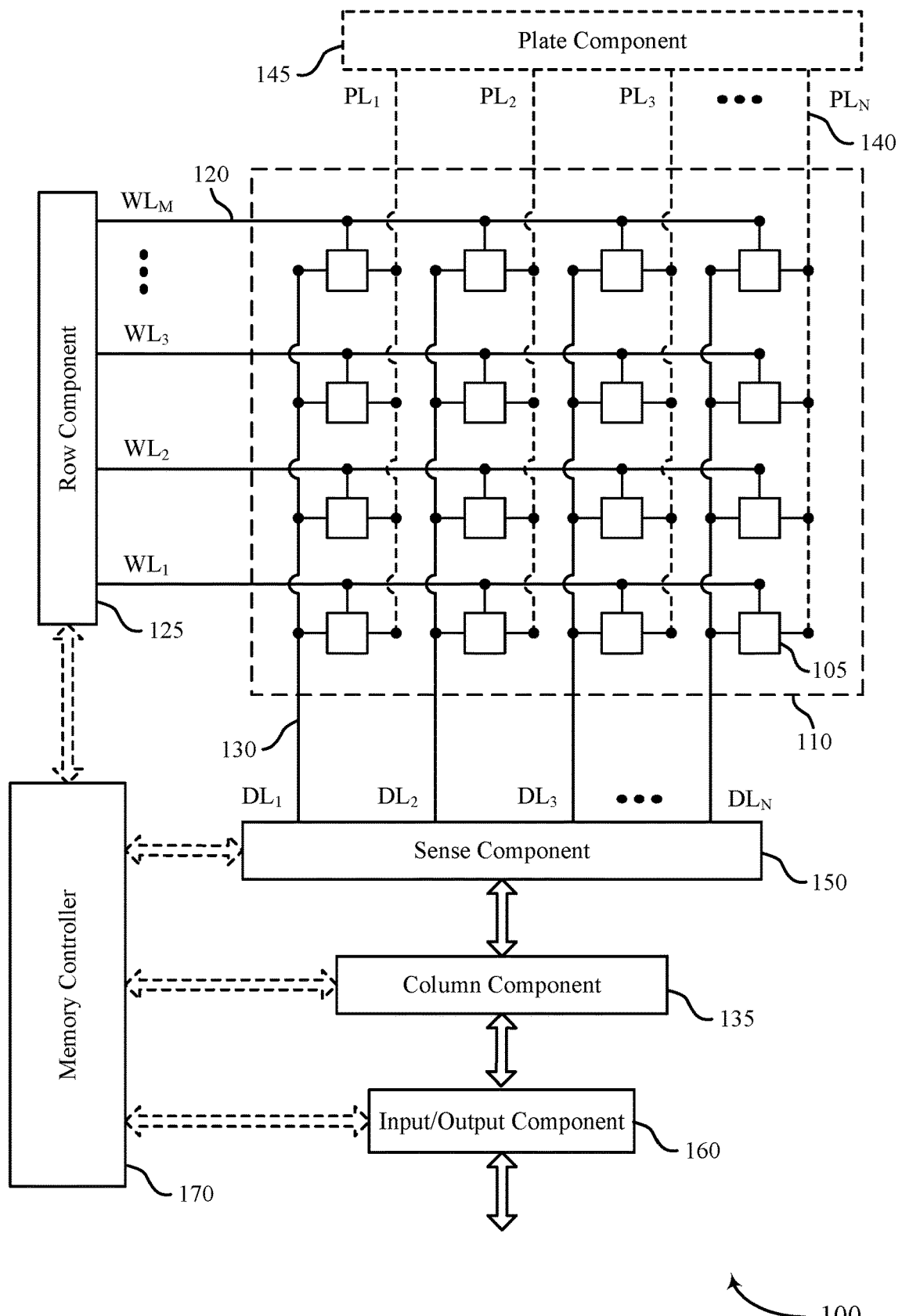
FIG. 1 illustrates an example memory device that supports access schemes for access line faults in accordance with examples of the present disclosure.

Access line faults or defects may lead to multiple problems and inefficiencies in related operation of a memory device. In some cases, access line faults or defects may cause errors in access operations, and some resulting techniques may be associated with unnecessary power consumption, further access operation errors, or other disadvantages A memory device may be operated more effectively by performing access schemes for access line faults in accordance with the present disclosure. For example, a memory device may include a set of memory cells (e.g., of a memory section) coupled with or between digit lines and plate lines or a common plate. Each of the memory cells may include a cell selection component configured to selectively couple the respective one of the memory cells with an associated digit line. In some examples, each of the cell selection components may be coupled (e.g., at a control node, a control terminal, a selection node, or selection terminal of the cell selection component) with at least one of a plurality of word lines, which may be used to activate or deactivate the particular cell selection component.

In some examples, a memory device may have faults or defects between access lines, such as a short circuit that permits charge or current (e.g., leakage charge or current, charge or current above a threshold) to incorrectly flow between access lines that are intended to be isolated from each other (e.g., are not intended to permit charge or current flow between them, intended to operate with charge or current between them being below the threshold amount of charge or current). Such faults may be related to manufacturing defects, inaccurate tolerances, errors (e.g., insufficient electrical isolation between access lines, an insulating or dielectric portion of the memory device having an insufficient thickness or dielectric strength between access lines, an electrically conductive material being inadvertently deposited between access lines), or may be related to operational or environmental conditions after manufacturing (e.g., dielectric breakdown, exposure to excessive temperatures or voltages, radiation exposure, improper operation, shipping damage, installation damage). The charge or current that flows across such a fault or defect between access lines may result in excessive power consumption or may cause errors in access operations, among other disadvantages.

Although an access line may be isolated from a voltage source that drives such leakage charge or current, such an isolation may result in unfavorable operation of the memory device. For example, when a cell selection component of a memory cell is isolated from a deselection voltage source that would otherwise drive a leakage charge or current, the cell selection component not be sufficiently deactivated. Without sufficient deactivation, a cell selection component may not sufficiently isolate the memory cell or associated storage element from a respective digit line, which may permit charge or current to flow to or from a memory cell that is not intended to be accessed in an access operation (e.g., a read operation, a write operation, a rewrite operation, a refresh operation), or otherwise participating in an access operation. In other words, when a cell selection component of one memory cell is not fully deactivated by being coupled with a deselection voltage, an access operation of another memory cell may not be properly performed or may provide an erroneous result.

In accordance with examples of the present disclosure, operations may be performed (e.g., during a standby or deselection period of an access line) to compensate for faults or defects associated with the access line while also supporting access operations being performed with other access lines. For example, a method of operating a memory device may include isolating a first word line of a section of the memory device from a voltage source during a first portion of a period when the first word line is deselected. The method may further include determining that an access operation associated with a second word line of the section of the memory device is performed during a second portion of the period when the first word line is deselected, and coupling the first word line with the voltage source during the second portion of the period when the first word line is deselected based at least in part on determining that the access operation associated with the second word line is performed during the second portion of the period when the first word line is deselected In another example, a circuit or memory controller of a memory device may be configured to identify that a first access line of a set of access lines (e.g., access lines of a memory section) is associated with a fault or defect (e.g., a short circuit fault of defect between the first access line and another access line). The circuit or memory controller may be further configured to receive a signal indicating whether an access operation is being performed with at least one of the set of access lines (e.g., an access operation of the memory section), and couple the first access line with the voltage source based at least in part on the signal indicating that the access operation is being performed, or isolate the first access line from a voltage source based at least in part on the signal indicating that the access operation is not being performed.

The selective isolating and coupling of a voltage source with an access line (e.g., a faulted access line) during a period when the access line is deselected (e.g., a deselection period of the access line, a standby period of the access line) may improve the operation of a memory device. For example, by isolating a faulted access line from a voltage source during a first portion of such a period, power consumption of a memory device may be reduced by reducing the amount of charge or current that is driven across the fault (e.g., compared with a condition where the voltage source is continuously coupled with the faulted or defective access line and continuously drives a charge or current across the fault).

However, by selectively coupling the voltage source with the faulted or defective access line during an access operation (e.g., an access operation associated with an access line different from the faulted or defective access line) of such a period, associated cell selection components may be more effectively deactivated, which may reduce or mitigate charge or current flowing across cell selection components to or from memory cells that are not associated with the access operation. By implementing the selective isolating and coupling described herein, a memory device may have improved tolerance to faults or defects between access lines, which may improve the operation of a memory device having such faults or defects, and may also improve manufacturing yield of memory devices because such faults or defects may be more effectively handled or tolerated.

Features of the disclosure introduced above are further described with reference to FIGS. 1 and 2 in the context of memory arrays and memory circuits that support access schemes for access line faults in a memory device. Specific examples are then described with reference to FIGS. 3 through 6, which illustrate particular circuits with associated timing diagrams that support access schemes for access line faults in a memory device. Further examples of circuits that may support the described operations are described with reference to FIGS. 7 through 10. These and other features of the disclosure are further described with respect to FIGS. 11 through 15, which illustrate apparatus diagrams, system diagrams, and flowcharts that support access schemes for access line faults in a memory device.

FIG. 1 illustrates an example memory device 100 that supports access schemes for access line faults in accordance with various embodiments of the present disclosure. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In some examples, the memory cells 105 may include a capacitive memory element, a ferroelectric memory element, a resistive element, a self-selecting memory element, or a combination thereof.

The set of memory cells 105 may be part of a memory section 110 of the memory device 100 (e.g., including an array of memory cells 105), where in some examples a memory section 110 may refer to a contiguous tile of memory cells 105 (e.g., a contiguous set of elements of a semiconductor chip). In some examples, a memory section 110 may refer to the smallest set of memory cells 105 that may be biased in an access operation, or a smallest set of memory cells 105 that share a common node (e.g., a common plate line, a set of plate lines that are biased to a common voltage). Although a single memory section 110 of the memory device 100 is shown, various examples of a memory device in accordance with the present disclosure may have a set of memory sections 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged and negatively charged capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating (e.g., non-conductive) layer between terminals of the capacitor. Different levels of polarization of a ferroelectric capacitor may represent different logic states (e.g., supporting two or more logic states in a respective memory cell 105). In some examples, ferroelectric materials have non-linear polarization properties.

In some examples, a memory cell 105 may include a material portion, which may be referred to as a memory element, a memory storage element, a self-selecting memory element, or a self-selecting memory storage element. The material portion may have a variable and configurable electrical resistance that is representative of different logic states. For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that may be substantially crystalline) may have a relatively low electrical resistance, and may alternatively be referred to as a "SET" logic state. A more-amorphous state of the material (e.g., an entirely amorphous state, some distribution of relatively small crystal grains that may be substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting memory may enhance differences in a threshold voltage of a memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. In various examples, such arrays may be divided into a set of memory sections 110, where each memory section 110 may be arranged within a deck or level, distributed across multiple decks or levels, or any combination thereof. Such arrangements may increase the number of memory cells 105 that may be placed or created on a single die or substrate as compared with 2D arrays, which in turn may reduce production costs or increase the performance of a memory device 100, or both. The decks or levels may be separated by an electrically insulating material. Each deck or level may be aligned or positioned so that memory cells 105 may be approximately aligned with one another across each deck, forming a stack of memory cells 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a digit line (DL), such as one of $DL_1$ through $DL_N$). In some examples, a row of memory cells 105 of a different memory section 110 (not shown) may be coupled with one of a different plurality of first access lines 120 (e.g., a word line different from $WL_1$ through $WL_M$), and a column of memory cells 105 of the different memory section 110 may be coupled with one of a different plurality of second access lines 130 (e.g., a digit line different from $DL_1$ through $DL_N$). In some cases, first access lines 120 and second access lines 130 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 120 and an access line 130. This intersection, or an indication of this intersection, may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive memory element, a ferroelectric memory element, a resistive memory element, other memory element) of a memory cell 105 may be electrically isolated from a second access line 130 by a cell selection component, which, in some examples, may be referred to as a switching component or a selector device. A first access line 120 may be coupled with the cell selection component (e.g., via a control node or terminal of the cell selection component), and may control the cell selection component of or associated with the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 of the memory section 110 may also be coupled with one of a plurality of third access lines 140 (e.g., a plate line (PL), such as one of $PL_1$ through $PL_N$). Although illustrated as separate lines, in some examples, the plurality of third access lines 140 may represent or be otherwise functionally equivalent with a common plate line, a common plate, or other common node of the memory section 110 (e.g., a node common to each of the memory cells 105 in the memory section 110), or other common node of the memory device 100. In some examples, the plurality of third access lines 140 may couple memory cells 105 with one or more voltage sources for various sensing and/or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor). In some examples, memory cells 105 of a different memory section 110 (not shown) may be coupled with one of a different plurality of third access lines 140 (e.g., a set of plate lines different from $PL_1$ through $PL_N$, a different common plate line, a different common plate, a different common node), which may be electrically isolated from the illustrated third access line 140 (e.g., plate lines $PL_1$ through $PL_N$).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 120, or with (e.g., between) a memory cell 105 and an access line 130. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

Access operations such as reading, writing, rewriting, and refreshing may be performed on a memory cell 105 by activating or selecting a first access line 120, a second access line 130, and/or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the logic state stored by the memory cell 105. For example, a memory cell 105 with a capacitive memory element storing a logic state may be selected, and the resulting flow of charge via an access line and/or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver), or a combination thereof. For example, a row component 125 may receive a row address from the memory controller 170 and select or activate the appropriate first access line 120 based on the received row address. Similarly, a column component 135 may receive a column address from the memory controller 170 and select or activate the appropriate second access line 130. Thus, in some examples, a memory cell 105 may be accessed by selecting or activating a first access line 120 and a second access line 130. In some examples, such access operations may be accompanied by a plate component 145 biasing one or more of the third access lines 140 (e.g., biasing one of the third access lines 140 of the memory section 110, biasing all of the third access lines 140 of the memory section, biasing a common plate line of the memory section 110 or the memory device 100, biasing a common node of the memory section 110 or the memory device 100), which may be referred to as "moving the plate" of memory cells 105, the memory section 110, or the memory device 100. In various examples, any one or more of the row component 125, the column component 135, or the plate component 145 may be referred to as, or otherwise include access line drivers or access line decoders.

In some examples, the memory controller 170 may control the operation (e.g., read operations, write operations, rewrite operations, refresh operations, discharge operations, voltage adjustment operations, dissipation operations, equalization operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. In some examples, any one or more of a row component 125, a column component 135, or a plate component 145 may also be referred to as a memory controller or circuit for performing access operations of the memory device 100. In some examples, any one or more of a row component 125, a column component 135, or a plate component 145 may be described as controlling or performing operations for accessing a memory device 100, or controlling or performing operations for accessing the memory section 110 of the memory device 100.

The memory controller 170 may generate row and column address signals to activate a desired access line 120 and access line 130. The memory controller 170 may also generate or control various voltages or currents used during the operation of memory device 100. For example, the memory controller 170 may apply a discharge or equalization voltage to one or more of an access line 120, an access line 130, or an access line 140 of a memory section 110 after accessing one or more memory cells 105. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions and/or different functions.

Although the memory device 100 is illustrated as including a single row component 125, a single column component 135, and a single plate component 145, other examples of a memory device 100 may include different configurations to accommodate a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110. Additionally, in various memory devices 100, a plate component 145 may be shared among a set of memory sections 110 (e.g., having subcomponents common to all of the set of memory sections 110, having subcomponents dedicated to respective ones of the set of memory sections 110), or a plate component 145 may be dedicated to one memory section 110 of a set of memory sections 110.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105 (e.g., the memory cells 105 of a memory section 110), are set to a single logic state.

A memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of the logic state stored by the memory cell 105 to one or more components (e.g., to the column component 135, the input/output component 160, the memory controller 170). In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

In some examples, during or after accessing a memory cell 105, the logic storage portion of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of a row component 125, a column component 135, a plate component 145, a sense component 150, a memory controller 170, or some other component (e.g., a biasing component). In some examples, a discharge of a memory cell 105 may cause a change in the voltage of the access line 130, which the sense component 150 may compare to a reference voltage to determine the stored state of the memory cell 105. In some examples, a voltage may be applied to a memory cell 105 (e.g., using the corresponding access line 120 and access line 130) and the presence of a resulting current may depend on the applied voltage and the resistance state of a memory element of the memory cell 105, which the sense component 150 may use to determine the stored state of the memory cell 105

In some examples, when a read signal (e.g., a read pulse, a read current, a read voltage) is applied across a memory cell 105 with a material memory element storing a first logic state (e.g., a SET state, associated with a more-crystalline atomic configuration), the memory cell 105 conducts current due to the read pulse exceeding a threshold voltage of the memory cell 105. In response or based on this, the sense component 150 may therefore detect a current through the memory cell 105 as part of determining the logic state stored by the memory cell 105. When a read pulse is applied to the memory cell 105 with the memory element storing a second logic state (e.g., a RESET state, associated with a more-amorphous atomic configuration), which may occur before or after the application of a read pulse across a memory cell 105 with a memory element storing a first logic state, the memory cell 105 may not conduct current due to the read pulse not exceeding the threshold voltage of the memory cell 105. The sense component 150 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 120, 130, or 140. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense component 150). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of access lines 130 connected to the sense component 150. For example, a sense component 150 may include a separate sensing circuit (e.g., a separate sense amplifier, a separate signal development component) for each of a set of access lines 130 coupled with the sense component 150, such that a logic state may be separately detected for a respective memory cell 105 coupled with a respective one of the set of access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110).

The sense component 150 may be included in a device that includes the memory device 100. For example, the sense component 150 may be included with other read and write circuits, decoding circuits, or register circuits of the memory that may be coupled to the memory device 100. In some examples, the detected logic state of a memory cell 105 may be output through a column component 135 as an output. In some examples, a sense component 150 may be part of a column component 135, a row component 125, or a memory controller 170. In some examples, a sense component 150 may be connected to or otherwise in electronic communication with a column component 135, a row component 125, or memory controller 170.

Although a single sense component 150 is shown, a memory device 100 (e.g., a memory section 110 of a memory device 100) may include more than one sense component 150. For example, a first sense component 150 may be coupled with a first subset of access lines 130 and a second sense component 150 may be coupled with a second subset of access lines 130 (e.g., different from the first subset of access lines 130). In some examples, such a division of sense components 150 may support parallel (e.g., simultaneous) operation of multiple sense components 150. In some examples, such a division of sense components 150 may support matching sense components 150 having different configurations or characteristics to particular subsets of the memory cells 105 of the memory device (e.g., supporting different types of memory cells 105, supporting different characteristics of subsets of memory cells 105, supporting different characteristics of subsets of access lines 130).

Additionally or alternatively, two or more sense components 150 may be coupled with a same set of access lines 130 (e.g., for component redundancy). In some examples, such a configuration may support maintaining functionality to overcome a failure or otherwise poor operation of one of the redundant sense components 150. In some examples, such a configuration may support the ability to select one of the redundant sense components 150 for particular operational characteristics (e.g., as related to power consumption characteristics, as related to access speed characteristics for a particular sensing operation, as related to operating memory cells 105 in a volatile mode or a non-volatile mode).

In some memory architectures, accessing the memory cell 105 may degrade or destroy the stored logic state and rewrite or refresh operations may be performed to return the original logic state to memory cell 105. In DRAM or FeRAM, for example, a capacitor of a memory cell 105 may be partially or completely discharged or depolarized during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write, refresh, or equalization pulse or bias to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 120, second access line 130, and/or third access line 140 (e.g., via a memory controller 170). In other words, a logic state may be stored in the memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of PCM, a memory element may be written by applying a current with a profile that causes (e.g., by way of heating and cooling) the memory element to form an atomic configuration associated with a desired logic state.

In some examples in accordance with the present disclosure, the memory device 100 may include a set of memory sections 110. Each of the memory sections 110 may include a set of memory cells 105 coupled with or between one of a set of second access lines 130 and one of a set of third access lines 140 (e.g., of the respective memory section 110). Each of the memory cells 105 may include a cell selection component configured to selectively couple the memory cell 105 with the associated second access line 130 or the associated third access line 140 (e.g., of the respective memory section 110). In some examples, each of the cell selection components may be coupled (e.g., at a control node or a control terminal of the respective cell selection component) with a respective one of the first access lines 120 (e.g., of the memory section 110), which may be used to activate or deactivate the particular cell selection component.

Access operations, which may include read operations, write operations, rewrite operations, refresh operations, or various combinations thereof, may be performed on selected memory cells 105 of a memory section 110. In some examples, access operations may be associated with biasing the second access line 130 or the third access line 140 associated with a selected memory cell 105. During the access operations, cell selection components for the selected memory cell 105 may be activated, such that selected memory cell 105 may be selectively coupled with the second access line 130 or the third access line 140. Thus, signals associated with the access operations (e.g., a voltage associated with an access operation, a charge associated with an access operation, a current associated with an access operation) may pass to, from, or through the selected memory cell 105 as a result of the biasing of the second access line 130 or the third access line 140 for the access operation.

In some examples, a memory device 100 may have faults between access lines 120, 130, or 140, such as a short circuit that permits charge or current (e.g., leakage charge or current, charge or current above a threshold, fault charge or current) to flow between access lines that are intended to be isolated from each other. The charge or current that flows across such a fault between access lines may result in excessive power consumption or may cause errors in access operations. In accordance with examples of the present disclosure, operations may be performed during a standby or deselection period of an access line (e.g., of an access line 120) to compensate for faults associated with the access line, while also supporting access operations being performed with other access lines. The selective isolating and coupling of a voltage source with an access line (e.g., a faulted access line 120) during a period when the access line is deselected or in a standby period or state may improve the operation of a memory device.

Figure 2:
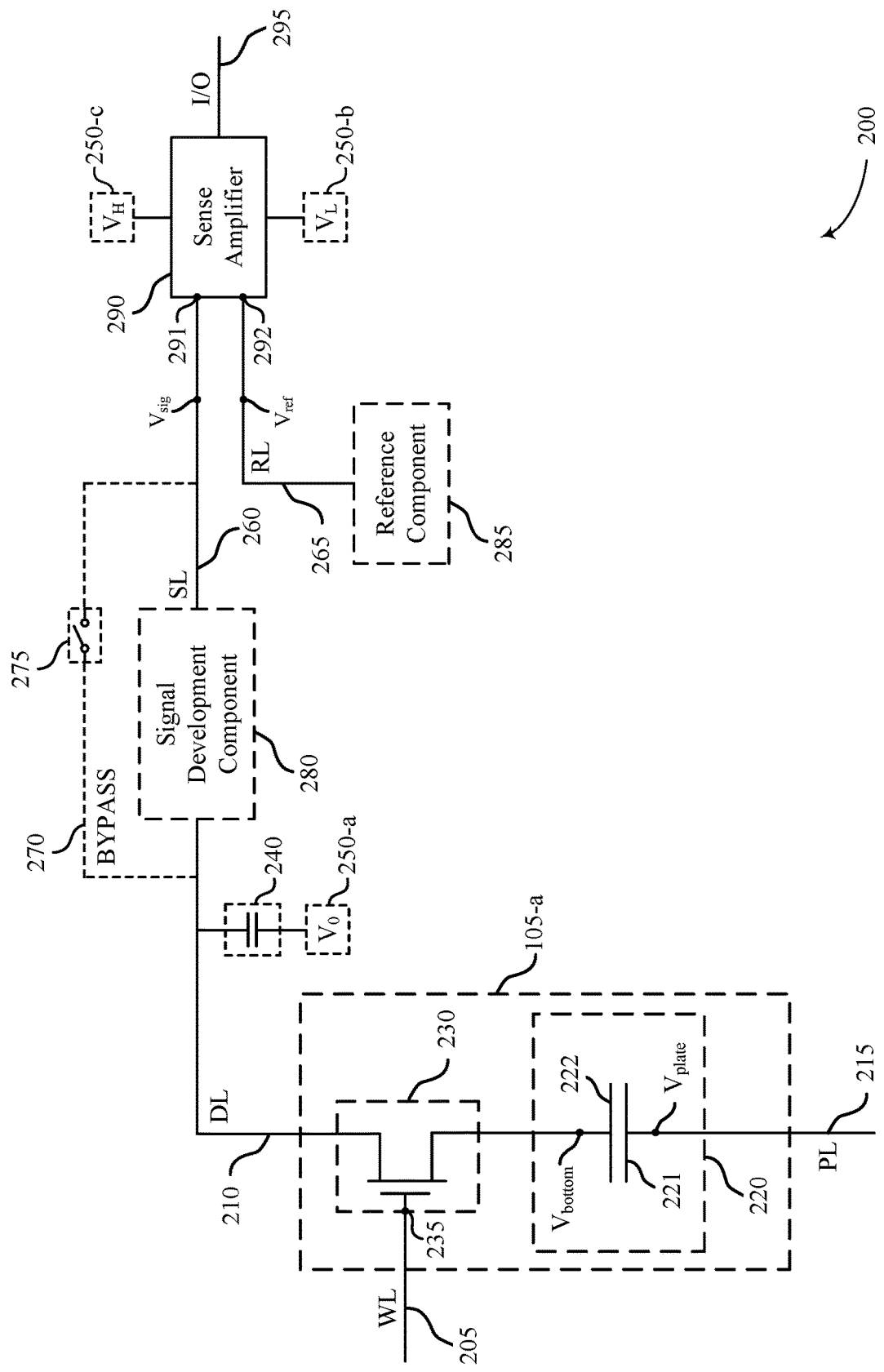
FIG. 2 illustrates an example circuit that supports access schemes for access line faults in a memory device in accordance with examples of the present disclosure.

FIG. 2 illustrates an example circuit 200 that supports access schemes for access line faults in a memory device 100 in accordance with various embodiments of the present disclosure. Circuit 200 may include a memory cell 105-a, which may be an example of a memory cell 105 described with reference to FIG. 1. Circuit 200 may also include a sense amplifier 290, which may be a portion of a sense component 150 described with reference to FIG. 1. Circuit 200 may also include a word line 205, a digit line 210, and a plate line 215, which, in some examples, may correspond to a first access line 120, a second access line 130, and a third access line 140, respectively (e.g., of a memory section 110), as described with reference to FIG. 1. In some examples, the plate line 215 may be illustrative of a common plate line, a common plate, or another common node for the memory cell 105-a and another memory cell 105 (not shown) of a same memory section 110. The circuit 200 may also include a reference line 265 used by the sense amplifier 290 to determine a stored logic state of the memory cell 105-a.

As illustrated in FIG. 2, the sense amplifier 290 may include a first node 291 and a second node 292 which, in some examples, may be coupled with different access lines of a circuit (e.g., a signal line 260 and a reference line 265 of the circuit 200, respectively) or a common access line of a different circuit (not shown). In some examples, the first node 291 may be referred to as a signal node, and the second node 292 may be referred to as a reference node. However, other configurations of access lines and/or reference lines are possible in accordance with various embodiments of the present disclosure.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various logic states may be stored by charging, discharging, or polarizing the capacitor 220.

The capacitor 220 may be in electronic communication with the digit line 210, and the stored logic state of the capacitor 220 may be read or sensed by operating various elements represented in circuit 200. For example, the memory cell 105-a may also include a cell selection component 230 which, in some examples, may be referred to as a switching component or a selector device coupled with an access line (e.g., the digit line 210) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 210) and the memory cell 105-a.

The capacitor 220 may be selectively coupled with the digit line 210 when the cell selection component 230 is activated (e.g., by way of an activating logical signal or voltage), and the capacitor 220 can be selectively isolated from the digit line 210 when the cell selection component 230 is deactivated (e.g., by way of a deactivating logical signal or voltage). A logical signal or other selection signal or voltage may be applied to a control node 235 (e.g., a control node, a control terminal, a selection node, a selection terminal) of the cell selection component 230 (e.g., via the word line 205). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting the memory cell 105-a in some examples, and deactivating the cell selection component 230 may be referred to as deselecting the memory cell 105-a in some examples. In some examples, the cell selection component 230 is a transistor (e.g., an n-type transistor) and its operation may be controlled by applying an activation or selection voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor (e.g., a positive activation or selection voltage). The voltage for deactivating the transistor may be a voltage less than the threshold voltage magnitude of the transistor (e.g., a ground or negative deactivation or deselection voltage).

The word line 205 may be used to activate or deactivate the cell selection component 230. For example, a selection voltage applied to the word line 205 (e.g., a word line logical signal or a word line voltage) may be applied to the gate of a transistor of cell selection component 230, which may selectively connect or couple the capacitor 220 with the digit line 210 (e.g., providing a conductive path between the capacitor 220 and the digit line 210). A deselection or deactivation voltage applied to the word line 205 may be applied to the gate of the transistor of cell selection component 230, which may selectively disconnect, decouple, or isolate the capacitor 220 from the digit line 210. In some examples, activating the cell selection component 230 may be referred to as selectively coupling the memory cell 105-a with the digit line 210, and deactivating the cell selection component 230 may be referred to as selectively decoupling or isolating the memory cell 105-a from the digit line 210.

In other examples, the positions of the cell selection component 230 and the capacitor 220 in the memory cell 105-a may be switched, such that cell selection component 230 may be coupled with or between the plate line 215 and the cell plate 221, and the capacitor 220 may be coupled with or between the digit line 210 and the other terminal of the cell selection component 230. In such an embodiment, the cell selection component 230 may remain in electronic communication with the digit line 210 through the capacitor 220. This configuration may be associated with alternative timing and biasing for access operations.

In examples that employ a ferroelectric capacitor 220, the capacitor 220 may or may not fully discharge upon connection to or coupling with the digit line 210. In various schemes, to sense the logic state stored by a ferroelectric capacitor 220, a voltage may be applied to the plate line 215 and/or the digit line 210, and the word line 205 may be biased (e.g., by activating the word line 205) to select the memory cell 105-a. In some cases, the plate line 215 and/or the digit line 210 may be virtually grounded and then isolated from the virtual ground, which may be referred to as a floating condition, an idle condition, or a standby condition, prior activating the word line 205.

Operation of the memory cell 105-a by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be used by the sense component 150-b to determine the stored logic state of the memory cell 105-a.

The digit line 210 may be coupled with additional memory cells 105 (not shown), and the digit line 210 may have properties that result in an intrinsic capacitance 240 (e.g., on the order of picofarads (pF), which may in some cases be non-negligible), which may couple the digit line 210 with a voltage source 250-a having a voltage $V_0$. The voltage source 250-a may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 210.

In some examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-a may depend on the net capacitance of (e.g., associated with) the digit line 210. In other words, as charge flows along the digit line 210 (e.g., to the digit line 210, from the digit line 210), some finite charge may be stored along the digit line 210 (e.g., in the intrinsic capacitance 240, other capacitance coupled with the digit line 210), and the resulting voltage of the digit line 210 may depend on the net capacitance of the digit line 210.

The resulting voltage of the digit line 210 after selecting the memory cell 105-a may be compared to a reference (e.g., a voltage of the reference line 265) by the sense component 150-b to determine the logic state that was stored in the memory cell 105-a. In some examples, a voltage of the reference line 265 may be provided by a reference component 285. In other examples, the reference component 285 may be omitted and a reference voltage may be provided, for example, by accessing the memory cell 105-a to generate the reference voltage (e.g., in a self-referencing access operation). Other operations may be used to support selecting and/or sensing the memory cell 105-a, including operations for supporting access schemes for access line faults as described herein.

In some examples, the circuit 200 may include a signal development component 280, which may be an example of a signal development circuit coupled with or between the memory cell 105-a and the sense amplifier 290. The signal development component 280 may amplify or otherwise convert signals of the digit line 210 prior to a sensing operation. The signal development component 280 may include, for example, a transistor, an amplifier, a cascode, or any other charge or voltage converter or amplifier component. In some examples, the signal development component 280 may include a charge transfer sensing amplifier (CTSA). In some examples with a signal development component 280, a line between the sense amplifier 290 and the signal development component 280 may be referred to as a signal line (e.g., signal line 260). In some examples (e.g., examples with or without a signal development component 280), the digit line 210 may connect directly with the sense amplifier 290.

In some examples, the circuit 200 may include a bypass line 270 that may permit selectively bypassing the signal development component 280 or some other signal generation circuit between the memory cell 105-a and the sense amplifier 290. In some examples, the bypass line 270 may be selectively enabled by way of a switching component 275. In other words, when the switching component 275 is activated, the digit line 210 may be coupled with the signal line 260 via the bypass line 270 (e.g., coupling the memory cell 105-a with the sense component 150-b).

In some examples, when the switching component 275 is activated, the signal development component 280 may be selectively isolated from one or both of the digit line 210 or the signal line 260 (e.g., by another switching component or selection component, not shown). When the switching component 275 is deactivated, the digit line 210 may be selectively coupled with the signal line 260 via the signal development component 280. In other examples, a selection component may be used to selectively couple the memory cell 105-a (e.g., the digit line 210) with one of the signal development component 280 or the bypass line 270.

Additionally or alternatively, in some examples, a selection component may be used to selectively couple the sense amplifier 290 with one of the signal development component 280 or the bypass line 270. In some examples, a selectable bypass line 270 may support generating a sense signal for detecting a logic state of the memory cell 105-a by using the signal development component 280, and generating a write signal to write a logic state to the memory cell 105-a that bypasses the signal development component 280.

Some examples of a memory device that supports the described access schemes for access line faults in the memory device may share a common access line (not shown) between a memory cell 105 and a sense amplifier 290 to support generating a sense signal and a reference signal from the same memory cell 105. In one example, a common access line between a signal development component 280 and a sense amplifier 290 may be referred to as a "common line," an "AMPCAP line," or an "AMPCAP node," and the common access line may take the place of the signal line 260 and the reference line 265 illustrated in circuit 200.

In such examples the common access line may be connected to the sense amplifier 290 at two different nodes (e.g., a first node 291 and a second node 292, as described herein). In some examples, a common access line may permit a self-referencing read operation to share, in both a signal generating operation and a reference generating operation, components that may exist between the sense amplifier 290 and a memory cell 105 being accessed. Such a configuration may reduce the sensitivity of the sense amplifier 290 to operational variations of various components in a memory device, such as memory cells 105, access lines (e.g., a word line 205, a digit line 210, a plate line 215), signal development circuits (e.g., signal development component 280), transistors, voltage sources 250, and others.

Although the digit line 210 and the signal line 260 are identified as separate lines, the digit line 210, the signal line 260, and any other lines connecting a memory cell 105 with a sense component 150 may be referred to as a single access line in accordance with the present disclosure. Constituent portions of such an access line may be identified separately for the purposes of illustrating intervening components and intervening signals in various example configurations.

The sense amplifier 290 may include various transistors or amplifiers to detect, convert, or amplify a difference in signals, which may be referred to as latching. For example, the sense amplifier 290 may include circuit elements that receive and compare a sense signal voltage (e.g., $V_{sig}$) at the first node 291 with a reference signal voltage (e.g., $V_{ref}$) at the second node 292. An output of the sense amplifier may be driven to a higher (e.g., a positive) or a lower voltage (e.g., a negative voltage, a ground voltage) based on the comparison at the sense amplifier 290.

For example, if the first node 291 has a lower voltage than the second node 292, the output of the sense amplifier 290 may be driven to a relatively lower voltage of a first sense amplifier voltage source 250-b (e.g., a voltage of $V_L$, which may be a ground voltage substantially equal to $V_0$ or a negative voltage). A sense component 150 that includes the sense amplifier 290 may latch the output of the sense amplifier 290 to determine the logic state stored in the memory cell 105-a (e.g., detecting a logic 0 when the first node 291 has a lower voltage than the second node 292).

If the first node 291 has a higher voltage than the second node 292, the output of the sense amplifier 290 may be driven to the voltage of a second sense amplifier voltage source 250-c (e.g., a voltage of $V_H$). A sense component 150 that includes the sense amplifier 290 may latch the output of the sense amplifier 290 to determine the logic state stored in the memory cell 105-a (e.g., detecting a logic 1 when the first node 291 has a higher voltage than the second node 292). The latched output of the sense amplifier 290, corresponding to the detected logic state of memory cell 105-a, may then be output via one or more input/output (I/O) lines (e.g., I/O line 295), which may include an output through a column component 135 via input/output component 160 described with reference to FIG. 1.

To perform a write operation on the memory cell 105-a, a voltage may be applied across the capacitor 220. Various methods may be used. In one example, the cell selection component 230 may be selected or activated through the word line 205 (e.g., by selecting or activating the word line 205) to electrically connect the capacitor 220 to the digit line 210. A voltage may be applied across capacitor 220 by controlling the voltage of the cell plate 221 (e.g., through the plate line 215) and the cell bottom 222 (e.g., through the digit line 210).

For example, to write a logic 0, the cell plate 221 may be taken high (e.g., applying a positive voltage to the plate line 215), and the cell bottom 222 may be taken low (e.g., grounding the digit line 210, virtually grounding the digit line 210, applying a negative voltage to the digit line 210). The opposite process may be performed to write a logic 1, where the cell plate 221 is taken low and the cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense amplifier 290 may be used to perform the write operations, which may include coupling the first sense amplifier voltage source 250-b or the second sense component voltage source 250-c with the digit line. When the sense amplifier 290 is used to perform the write operations, the signal development component 280 may or may not be bypassed (e.g., by applying a write signal via the bypass line 270).

The circuit 200, including the sense amplifier 290, the cell selection component 230, the signal development component 280, or the reference component 285, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage, or a negative voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage, or a positive voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be different (e.g., more complex) than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 290, a substrate for the signal development component 280, a substrate for the memory cell 105-a), or the transistor(s) may be formed on a substrate that is common for particular components of the circuit 200 (e.g., a substrate that is common for the sense amplifier 290, the signal development component 280, and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In some examples, the word line 205 and the digit line 210 are intended to be isolated from each other (e.g., not conducting charge or current outside the illustrative boundary of the cell selection component 230, not conducting charge outside the illustrative boundary of the memory cell 105-a), but the circuit 200 may include a fault or defect (e.g., a short circuit) between the them. In other words, a short circuit may exist between the word line 205 and the digit line 210 and the short circuit may permit charge or current to flow between the lines at a level that is above a threshold. The charge or current that flows across such a fault between the word line 205 and the digit line 210 may result in excessive power consumption or may cause errors in access operations, which in some examples may result in failure of a memory device 100 or rejection of a memory device 100 at a manufacturing or assembly operation.

In accordance with embodiments of the present disclosure, a memory device 100 that includes the circuit 200 may detect such a fault, or otherwise identify that such a fault exists (e.g., as detected during a manufacturing or operational test of the circuit 200), and initiate a standby or deselection period of the word line 205 based on detecting or identifying the fault (e.g., initiating a standby state, initiating a deselection state, disabling or initiating a disabled state or period of the word line 205, initiating a fault state or period of the word line 205, excluding memory cells 105 associated with word line 205 from being accessed).

As described herein, operations may be performed during the standby or deselection period of the word line 205 to compensate for the fault associated with the word line 205, while also supporting access operations being performed with other word lines 205 (not shown). For example, a selective isolating and coupling of a voltage source (e.g., a deselection voltage source) with the word line 205 during a period when the word line 205 is deselected may improve the operation of a memory device 100 that includes the circuit 200.

Figure 3:
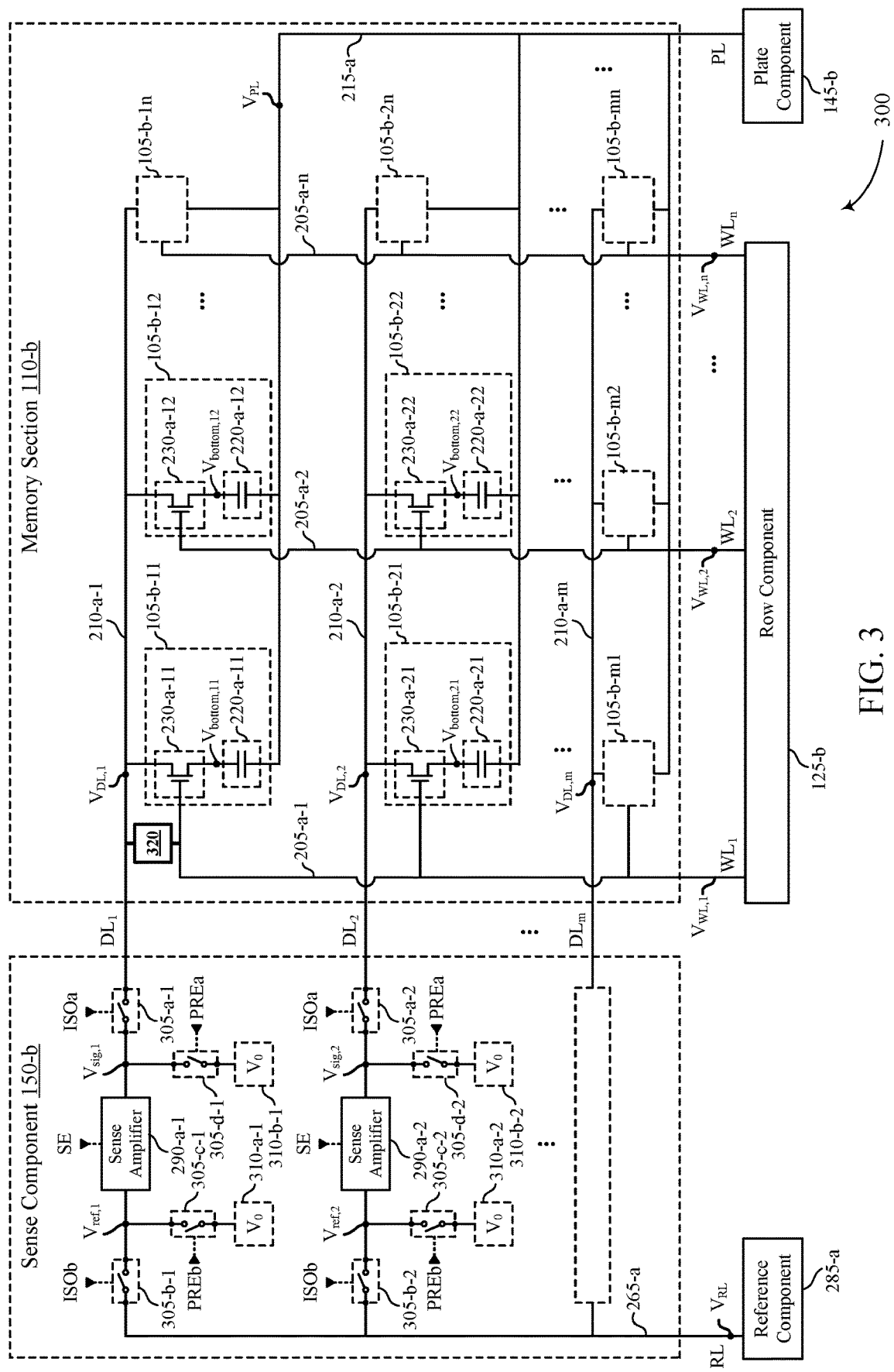
FIG. 3 illustrates an example circuit that supports access schemes for access line faults in a memory device in accordance with examples of the present disclosure.

FIG. 3 illustrates an example circuit 300 that supports access schemes for access line faults in a memory device in accordance with various embodiments of the present disclosure. Components of the circuit 300 may be examples of the corresponding components described with reference to FIGS. 1 and 2.

The circuit 300 may include a memory section 110-b including a set of memory cells 105-b (e.g., memory cells 105-b-11 through 105-b-mn), which may be illustrative of an array of memory cells 105 having m columns and n rows. Each of the memory cells 105-b may be coupled with a word line 205-a of the memory section 110-b (e.g., one of word lines 205-a-1 through 205-a-n), a digit line 210-a of the memory section 110-b (e.g., one of digit lines 210-a-1 through 210-a-m), and a plate line 215-a of the memory section 110-b. Although illustrated as including a common plate line 215-a, some examples of a circuit 300 may include a separate plate lines 215-a for each row of memory cells 105-b (e.g., an independently accessible plate line 215-a associated with each of the word lines 205-a) or separate plate lines 215-a for each column of memory cells 105-b (e.g., an independently accessible plate line 215-a associated with each of the digit lines 210-a), or separate plate lines 215-a for some other subsets of the memory cells 105-b.

According to the example illustrated by circuit 300, memory cells 105-b-11 through 105-b-1n may represent a set (e.g., a column) of memory cells 105-b of the memory section 110-b that are coupled with or between a digit line of the memory section 110-b (e.g., digit line 210-a-1) and a plate line of the memory section 110-b (e.g., common plate line 215-a). Further, memory cells 105-b-m1 through 105-b-mn may represent a set (e.g., another column) of memory cells 105-b of the memory section 110-b that are coupled with or between a different digit line of the memory section 110-b (e.g., digit line 210-a-m) and a plate line of the memory section 110-b (e.g., common plate line 215-a).

According to the example illustrated by circuit 300, memory cells 105-b-11 through 105-b-m1 may represent a set (e.g., a row) of memory cells 105-b of the memory section 110-b that are coupled with a word line of the memory section 110-b (e.g., word line 205-a-1). Further, memory cells 105-b-1n through 105-b-mn may represent a set (e.g., another row) of memory cells 105-b of the memory section 110-b that are coupled with a different word line of the memory section 110-b (e.g., word line 205-a-n).

In the example of circuit 300, each of the memory cells 105-b may include a respective capacitor 220-a and a respective cell selection component 230-a. A voltage at a point (e.g., a node, an intermediate node, a terminal) between the respective capacitor 220-a and the respective cell selection component 230-a may be identified as a respective $V_{bottom}$, as illustrated throughout the memory section 110-b. In some examples, one or more of the capacitors 220-a may be ferroelectric capacitors as described herein. The memory section 110-b may be an example of a memory section 110 that includes memory cells 105-b associated with one of a plurality of word lines 205-a of the memory section 110-b that is configured to selectively couple the memory cell 105-b with one of a plurality of digit lines 210-a of the section.

Each of the word lines 205-a (e.g., each of the word lines $WL_1$ through $WL_n$) may be associated with a respective word line voltage $V_{WL}$ as illustrated, and may be coupled with a row component 125-b. The row component 125-b may couple one or more of the word lines 205-a with various voltage sources (not shown). For example, the row component 125-b may selectively couple one or more of the word lines 205-a with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage).

In another example, the row component 125-b may selectively couple one or more of the word lines 205-a with one of three voltage sources. In some examples, a first voltage source may have an idle or standby voltage (e.g., a ground voltage, a relatively small positive voltage, a negative voltage), a second voltage source may have a selection voltage (e.g., a positive voltage greater than a ground voltage, a relatively large positive voltage), and a third voltage source may have a deselection voltage (e.g., a ground voltage, a negative voltage). Some examples may further include a word line equalization voltage source to support various operations, which may be a fourth voltage source.

The word lines 205-a may be grouped in different subsets or subsections, and the word lines 205-a of a respective subset or subsection may share common characteristics or be accessed with common subcomponents of the row component 125-b. For example, the row component 125-b may include a set of decoders, and each of the set of decoders may be associated with a respective one of the subsets of subsections of word lines 205-a. Such an arrangement may facilitate the addressing of word lines 205-a or groups of word lines 205-a, and may be used during access operations associated with a word line 205-a or group of word lines 205-a.

Each of the digit lines 210-a (e.g., each of the digit lines $DL_1$ through $DL_m$) may be associated with a respective digit line voltage $V_{DL}$ as illustrated, and may be coupled with a sense component 150-b. In the example of circuit 300, each of the digit lines 210-a are illustrated as direct connections between the memory section 110-b and the sense component 150-b (e.g., directly coupling the memory section 110-b with the sense component 150-b). In other examples of circuits that support the described access schemes or operations, additional components or elements may be coupled with or between a memory section 110 and a sense component 150, including an intrinsic capacitance 240, one or more signal development components 280, or one or more bypass lines 270, as described with reference to FIG. 2. In some examples, the circuit 300 may also include a set of signal lines (e.g., signal lines $SL_1$ through $SL_m$) as described with reference to FIG. 2.

Each of the one or more plate lines 215-a (e.g., plate line PL, a common plate for the memory section 110-b, a common node of the memory section 110-b) may be associated with a plate line voltage $V_{PL}$ as illustrated, and may be coupled with a plate component 145-a. The plate component 145-b may couple one or more plate lines 215-a with various voltage sources (not shown). For example, the plate component 145-b may selectively couple one or more plate lines 215-a with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

The row component 125-b, the sense component 150-b, and the plate component 145-b may be configured to support various access operations (e.g., read operations, write operations, rewrite operations, refresh operations, and others) for the memory section 110-b. For example, the row component 125-b may be configured to select, activate, or otherwise apply a voltage to particular word lines 205-a. In some examples, selecting or activating a word line 205-a may select or activate the cell selection component 230-a for one or more of the memory cells 105-b that are coupled with the respective word line 205-a. For example, activating the word line 205-a-1 may select or activate all of the cell selection components 230-a-11 through 230-a-m1 associated with memory cells 105-b-11 through 105-b-m1 (e.g., a row of memory cells 105-b of the memory section 110-b).

The sense component 150-b may include a set of sense amplifiers 290-a configured to detect a logic state stored by respective ones of the memory cells 105-b. In some examples, the sense amplifiers 290-a may detect a logic state stored by comparing a respective digit line voltage $V_{DL}$ with a reference line voltage $V_{RL}$, which may be provided to the sense component 150-b by a reference component 285-a (e.g., via reference line 265-a). The plate component 145-b may be configured to select, activate, or otherwise apply a voltage to particular one or more of the plate lines 215-a. In some examples, operations associated with the row component 125-b, the sense component 150-b, the plate component 145-b, or the reference component 285-a may be controlled at least in part by a memory controller 170 (not shown).

In the example of circuit 300, the sense component 150-b may include a separate sense amplifier 290-a associated with each of the digit lines 210-a (e.g., a separate sense amplifier 290-a for each column of memory cells 105-b). Each of the sense amplifiers 290-a may be coupled with other portions of a memory device, such as a column component 135, an input/output component 160, or a memory controller 170 (e.g., via one or more I/O lines 295, not shown). Each of the sense amplifiers 290-a may be associated with a respective signal voltage $V_{sig}$ and a respective reference voltage $V_{ref}$ as illustrated. Each of the sense amplifiers 290-a may be coupled with a first sense amplifier voltage source (e.g., having a voltage of $V_L$, which may be a ground voltage substantially equal to $V_0$, or a negative voltage), and coupled with a second sense amplifier voltage source (e.g., having a voltage of $V_H$, which may be greater than the voltage of $V_L$), such as those described with reference to FIG. 2

The sense component 150-b may, in some examples, be used to latch signals associated with a read operation when detecting a logic state stored by memory cells 105-b. Electrical signals associated with such latching may be communicated between the sense component 150-b (e.g., a sense amplifier 290-a) and an input/output component 160, for example, via I/O lines 295 (not shown). In some examples, the sense component 150-b may be in electronic communication with a memory controller (not shown), such as a memory controller 170 described with reference to FIG. 1, which may control various operations of the sense component 150-b. In some examples, activating logical signal SE may be referred to as "enabling" or "activating" the sense component 150-b. In some examples, activating logical signal SE may be referred to, or be part of an operation known as "latching" the result of accessing memory cells 105.

In the example of circuit 300, each of the sense amplifiers 290-a may be selectively coupled or decoupled with various portions of the circuit 300 by various switching components 305. In some examples, each of the sense amplifiers 290-a may include a switching component 305-a, which may be used to selectively couple or decouple the respective sense amplifier 290-a and a respective digit line 210-a (e.g., by activating or deactivating a logical signal ISOa). In some examples, each of the sense amplifiers 290-a may include a switching component 305-b, which may be used to selectively couple or decouple the respective sense amplifier 290-a and a reference source, such as the reference component 285-a (e.g., by activating or deactivating a logical signal ISOb).

In some examples, each of the sense amplifiers 290-a may include a switching component 305-c, which may be used to selectively couple or decouple the respective sense amplifier 290-a and a respective equalization voltage source 310-a (e.g., by activating or deactivating a logical signal PREb). In some examples, each of the sense amplifiers 290-a may include a switching component 305-d, which may be used to selectively couple or decouple the respective sense amplifier 290-a and a respective equalization voltage source 310-b (e.g., by activating or deactivating a logical signal PREa). In some examples, the voltage sources 310-a or 310-b may represent a common grounding point (e.g., a chassis ground, a neutral point), which may be associated with a common reference voltage having a voltage $V_0$, from which other voltages are defined. Although each of the equalization voltage sources 310-a and 310-b are illustrated as having the same voltage (e.g., $V_0$), in other examples, the voltage of any one or more of the voltage sources 310-a or 310-b may be different.

Any one or more of the logical signals (e.g., ISOa, ISOb, PRE, or SE) illustrated in circuit 300 may be provided by a memory controller (not shown), such as a memory controller 170 described with reference to FIG. 1. Although certain switching components 305 are illustrated as sharing common logical signals, any of the switching components 305 may be activated or deactivated by a logical signal that is specific to a given switching component 305 (e.g., a logical signal specific to a particular one of the digit lines 210-*a*).

In some examples, each of the switching components 305-*a* may be activated or deactivated by a same logical signal (e.g., ISOa), or any one or more of the switching components 305-*a* may be activated or deactivated by a logical signal that is different from another of the switching components 305-*a*. In some examples, each of the switching components 305-*b* may be activated or deactivated by the same logical signal (e.g., ISOb), or any one or more of the switching components 305-*b* may be activated or deactivated by a logical signal that is different from another of the switching components 305-*b*.

In some examples, each of the switching components 305-*c* may be activated or deactivated by the same logical signal (e.g., PREb), or any one or more of the switching components 305-*c* may be activated or deactivated by a logical signal that is different from another of the switching components 305-*c*. In some examples, each of the switching components 305-*d* may be activated or deactivated by the same logical signal (e.g., PREa), or any one or more of the switching components 305-*d* may be activated or deactivated by a logical signal that is different from another of the switching components 305-*d*.

Although circuit 300 is illustrated with a separate reference voltage source (e.g., reference component 285-*a*), other embodiments or configurations that support the described access schemes for access line faults in a memory device may employ a self-referencing access scheme, where a reference voltage for reading a respective memory cell 105-*b* may be provided at least in part by accessing the respective memory cell 105-*b* (e.g., in a subsequent operation). In such examples, the memory cell 105-*b* may be coupled with a reference node of the respective sense amplifier 290-*a*. In other words, to support a self-referencing scheme, in some examples, a respective digit line 210-*a* may be coupled with both a respective switching component 305-*a* and a respective switching component 305-*b* of the sense component 150-*b*.

In some cases, although voltage sources 310-*a* or 310-*b* may be coupled with common voltage supplies and/or grounding points, the voltage at each of the voltage sources 310-*a* or 310-*b* coupled with a common voltage supply or common grounding point may be different due to various differences in the circuit 300 (e.g., conductor length, conductor width, conductor resistance, conductor or other capacitance) between the respective voltage sources 310-*a* or 310-*b* and the associated common voltage supply or common grounding point.

Although the memory section 110-*b* and the sense component 150-*b* are illustrated with respective dashed lines as reflecting particular boundaries, such boundaries are shown for illustrative purposes only. In other words, one or both of the memory section 110-*b* and the sense component 150-*b* in accordance with the present disclosure may have boundaries different than the dashed boundaries shown in the circuit 300, and accordingly may include more or fewer components than illustrated in the example of FIG. 3.

In one example, a memory device may have more than one set of digit lines 210 coupled with a sense component 150-*b*, which may be selected via a column selection component or level selection component. For example, the digit lines 210-*a*-1 through 210-*a*-*m* of circuit 300 may illustrate a first set of digit lines (e.g., a first set of columns, a first level of columns) coupled with the sense component 150-*b*. Another set of digit lines (e.g., digit lines 210-*b*-1 through 210-*b*-*m*, not shown) may refer to a second set of digit lines (e.g., a second set of columns, a second level of columns) coupled with the sense component 150-*b* that may have a similar arrangement as the first set of digit lines (e.g., coupled with a different set of memory cells 105, not shown).

In some examples a circuit of a memory device 100 may include a column selection component or level selection component between the sense component 150-*b* and the first and second sets of digit lines to select whether a digit line 210 of the first set of digit lines is coupled with the sense component 150-*b* or a digit line 210 of the second set of digit lines is coupled with the sense component 150-*b*. In some examples, different sets of digit lines 210 or columns may share common word lines 205. In other words, in some examples, a word line 205 may activate cell selection components 230 of memory cells 105 (e.g., rows) in different sets of columns or associated with different sets of digit lines 210. In some examples, different sets of digit lines 210 or columns may also share signal lines between a memory section 110 and a sense component 150 (e.g., between a sense component 150 and a column selection component or level selection component). Thus, a particular memory cell 105 may be accessed with a combination of a particular word line address, a digit line or signal line address, and a column selection or level selection address (e.g., a "Y-address").

In some examples in accordance with the present disclosure, memory cells 105 associated with the first set of digit lines 210 and the second set of digit lines 210 may be considered to be part of the same memory section 110 (e.g., digit lines 210-*a*-1 through 210-*a*-*m* and digit lines 210-*c*-1 through 210-*c*-*m* being included in the memory section 110-*b*, digit lines 210-*a*-1 through 210-*a*-*m* and digit lines 210-*c*-1 through 210-*c*-*m* sharing a common plate line 215-*a*). In some examples in accordance with the present disclosure, memory cells 105 associated with a first set of digit lines 210 and a second set of digit lines 210 may be considered to be part of different memory sections 110 (e.g., digit lines 210-*a*-1 through 210-*a*-*m* being included in the memory section 110-*b* and coupled with the plate line 215-*a*, and digit lines 210-*c*-1 through 210-*c*-*m* being included in another memory section 110-*c*, not shown, and coupled with another plate line 215-*b*, not shown).

As illustrated in FIG. 3, the circuit 300 may include a fault 320 between the word line 205-*a*-1 (e.g., WL$_1$) and the digit line 210-*a*-1 (e.g., DL$_1$). The fault 320 may include or illustrate a short circuit that permits charge or current (e.g., leakage charge or current, charge or current above a threshold, fault charge or current) to flow between the word line 205-*a*-1 and the digit line 210-*a*-1 when the word line 205-*a*-1 and the digit line 210-*a*-1 are biased at different voltages (e.g., when V$_{WL,1}$ is different from V$_{DL,1}$). Although described with reference to a short circuit fault or defect, the fault 320 may refer to other kinds of faults or defects between the word line 205-*a*-1 and the digit line 210-*a*-1. A charge or current that flows across the fault may result in excessive power consumption by the circuit 300, or may result in access operation errors.

A memory device 100 that includes the circuit 300 may detect one or more faults 320 or otherwise identify the presence of the fault 320, and may initiate a standby or deselection period (e.g., a standby state, a deselected state, a disabled state, a fault state) of the word line 205-*a*-1 based at least in part on detecting or identifying the fault 320. The memory device 100 may perform certain operations during the standby or deselection period. In some examples, initiating the standby or deselection period may be associated with an operational state where memory cells 105-*b* coupled with the word line 205-*a*-1 (e.g., a row of memory cells) are not used for storing or reading data, or where the word line 205-*a*-1 or the memory cells 105-*b*-11 through 105-*b*-m1 are instead replaced with a different word line 205-*a*-1 or row of memory cells (e.g., a redundancy word line 205-*a*, a row of redundancy memory cells 105-*a*). For example, instead of storing data by activating or otherwise accessing the word line 205-*a*-1, a different one of the word lines 205-*a* of the memory section 110-*b* may be activated or otherwise accessed to provide the storage functionality. In other words, based on detecting or otherwise identifying the fault 320, the memory cells 105-*b* associated with the word line 205-*a*-1 may be operationally disabled in some examples (e.g., for the purpose of storing or reading data).

During some access operations of the circuit 300 (e.g., read operations, write operations, rewrite operations, refresh operations), when a first word line 205-*a* of the memory section 110-*b* is selected or activated, other word lines 205-*a* of the memory section 110-*b* may be deselected or deactivated. In some examples, a word line deselection or deactivation voltage is a negative voltage, which may support more-effectively isolating deselected memory cells 105-*b* (e.g., capacitors 220-*a*) from respective digit lines 210-*a* than when the word line deselection or deactivation voltage is a ground voltage (e.g., 0V). Thus, in some examples, the word line 205-*a*-1 that is associated with the fault 320 may be biased with a negative deselection or deactivation voltage during at least a portion of the standby or deselection period of the word line 205-*a*-1.

In some cases, the digit line 210-*a*-1 may be biased with voltages, such as a ground voltage (e.g., a bias of 0V), during certain portions of the standby or deselection period of the word line 205-*a*-1. For example, the digit line 210-*a*-1 may be biased with a ground voltage when the digit line 210-*a*-1 is coupled with the voltage source 310-*b*-1 (e.g., when switching components 305-*a*-1 and 305-*d*-1 are activated), or when the digit line 210-*a*-1 is coupled with the sense amplifier 290-*a*-1 (e.g., when the switching component 305-*a*-1 is activated) that is otherwise grounded (e.g., via an I/O component, not shown).

In some examples the digit line 210-*a*-1 may be selectively coupled with other voltage sources that provide a ground voltage (e.g., a digit line equalization voltage source or digit line precharge voltage source, not shown). When the digit line 210-*a*-1 is biased with a ground voltage during a period or state when the word line 205-*a*-1 is biased with a non-zero voltage (e.g., a negative deselection or deactivation voltage), a charge or current may flow across the fault 320 (e.g., as driven by the voltage $V_{DL,1}$ being different from the voltage $V_{WL,1}$), which may be a charge or current that is greater than a typical or acceptable standby charge or current of the circuit 300 that flows between access lines that are intended to be isolated.

The standby current of a memory circuit (e.g., circuit 300) may be determined by specifications, and for acceptable performance or operation such standby currents may need to be held below a threshold (e.g., during standby operations, during a standby state). In one example, an acceptable threshold for standby current may be a maximum of 100 µA, and a standby current of the circuit 300 without any faults 320 may be 60 µA. In an example where the fault 320 is associated with an electrical resistance of 5 kOhm, the fault 320 may result in an additional standby current of 40 µA when the digit line 210-*a*-1 is biased with a ground voltage and the word line 205-*a*-1 is biased with a deselection or deactivation voltage of –0.2V. Thus, the single fault 320 may cause the circuit 300 to be at the maximum threshold for standby current, and any additional faults 320 may cause the circuit to fail the standby current threshold.

Accordingly, under such an operating scheme, the circuit 300 may be rejected due to some number of faults 320, which may reduce a production yield associated with producing the circuit 300. Thus, under certain conditions, it may be preferable not to bias the word line 205-*a*-1 with a negative deselection voltage during the standby or deselection period of the word line 205-*a*-1 (e.g., to satisfy a standby current requirement). Accordingly, in some conditions, the word line 205-*a*-1 may be isolated from a voltage source (e.g., floating) during a period then the word line 205-*a*-1 is deselected (e.g., in a standby state).

In some conditions, however, not applying a negative deselection voltage during the standby or deselection period of the word line 205-*a*-1 may cause unfavorable behavior during an access operation. For example, when the word line 205-*a*-2 is activated (e.g., during an access operation using the word line WL$_2$), the memory cell 105-*b*-12 (e.g., capacitor 220-*a*-12) may be coupled with the digit line 210-*a*-1 via the cell selection component 230-*a*-12, the memory cell 105-*b*-22 (e.g., capacitor 220-*a*-22) may be coupled with the digit line 210-*a*-2 via the cell selection component 230-*a*-22, and so on.

Due to the fault 320 (e.g., current or charge flowing across the fault 320), the voltage of the word line 205-*a*-1 may change to match the voltage of the digit line 210-*a*-1, and a rise in voltage $V_{WL,1}$ may subsequently activate the cell selection components 230-*a* associated with the word line 205-*a*-1 (e.g., activating the cell selection components 230-*a* of the row of memory cells 105-*b*-11 through 105-*b*-m1). In other words, under such conditions, when activating the word line 205-*a*-2, both the memory cell 105-*b*-11 and the memory cell 105-*b*-12 may be coupled with the digit line 210-*a*-1, both the memory cell 105-*b*-21 and the memory cell 105-*b*-22 may be coupled with the digit line 210-*a*-2, and so on, which may cause access operation errors when performing an access operation using the word line 205-*a*-2.

In some examples, the digit line 210-*a*-1 (e.g., a digit line 210 associated with a fault 320) may be replaced with a redundant digit line 210-*a* (e.g., another of the digit lines 210-*a*-2 through 200-*a*-*m*) as part of a manufacturing test or wafer test or other operational transition, such that the column of memory cells 105-*b*-11 through 105-*b*-1*n* associated with the fault 320 is not used for storing data. When the other digit lines 210-*a* (e.g., digit line 210-*a*-2 through digit line 210-*a*-*m*) are not associated with a fault, the memory cells 105-*b* associated with those other digit lines 210 (e.g., memory cells 105-*b*-21 through 105-*b*-*mn*) may still be used for storing data, but may be adversely affected by the coupling of multiple memory cells 105-*b* (e.g., multiple rows of the memory section 110-*b*) described above. Thus, under some conditions, such as when performing an access operation with a non-faulted word line 205-*a* (e.g., one of the word lines 205-*a*-2 through 205-*a*-*n*) of the memory section 110-*b*, it may be preferable to couple the word line 205-*a*-1 associated with the fault 320, or a group of word lines that include the word line 205-*a*-1, with a deselection or deactivation voltage (e.g., a negative voltage), which may prevent or mitigate the described coupling of multiple memory cells 105-*b* with a respective digit line 210-*a*.

Thus, in accordance with examples of the present disclosure, operations may be performed during the standby or deselection period of the word line 205-a-1 to compensate for the fault 320, while also supporting access operations being performed with other word lines 205-a-2 through 205-a-n. For example, a selective isolating of a voltage source (e.g., a deselection or deactivation voltage source) with the word line 205-a-1 during a period when the word line 205 is deselected may reduce standby currents during certain portions of the period, while a selective coupling of the voltage source with the word line 205-a-1 may support access operations of other word lines 205-a-2 through 205-a-n during certain portions of the period.

Figure 4:
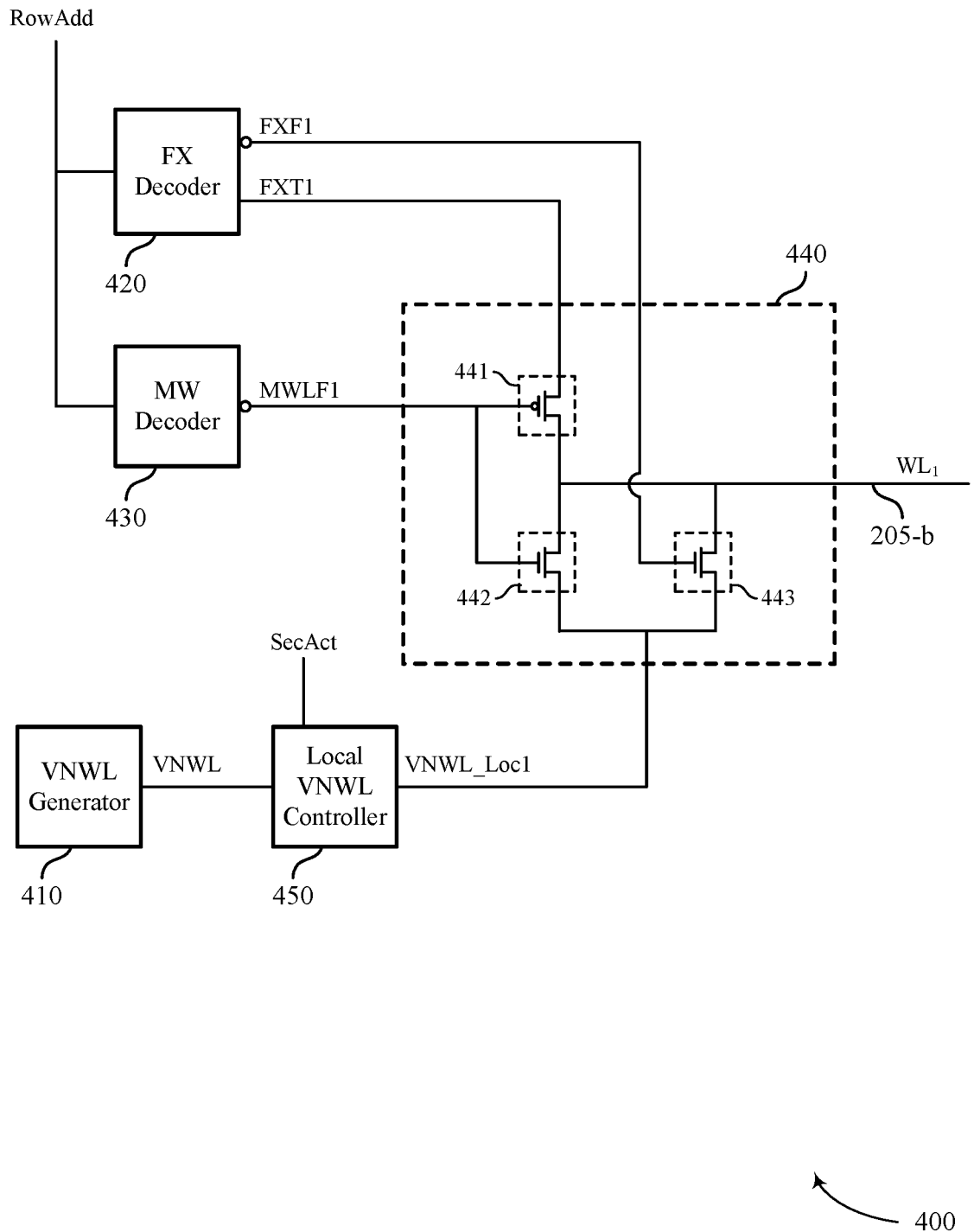
FIG. 4 illustrates an example circuit that supports access schemes for access line faults in a memory device in accordance with examples of the present disclosure.

FIG. 4 illustrates an example circuit 400 that supports access schemes for access line faults in a memory device in accordance with various embodiments of the present disclosure. The circuit 400 may be an example of or included in a circuit or a memory controller configured to drive or bias a word line 205-b (e.g., $WL_1$ described with reference to circuit 300 of FIG. 3) with a voltage (e.g., a selection or deselection voltage, an activation or deactivation voltage). The circuit 400 includes a VNWL generator 410, an FX decoder 420, an MW decoder 430, a word driver 440, and a local VNWL controller 450. In various examples, any one or more of the components of the circuit 400 may be included in a row component 125 or a memory controller 170.

The VNWL generator 410 may provide a voltage that is associated with deselecting or deactivating a word line 205 (e.g., deselecting or deactivating cell selection components 230, decoupling or isolating memory cells 105 or capacitors 220 from a digit line 210). In some examples, the VNWL generator 410 may supply a negative voltage (e.g., −0.2V). In various examples, the VNWL generator 410 may be referred to as a voltage source, a negative voltage source, a word line deselection voltage source, a word line deactivation voltage source, a row deselection voltage source, a row deactivation voltage source, or a memory cell deselection voltage source.

The FX decoder 420 may receive a signal RowAdd, which may indicate an address of a memory section 110, a portion of a memory section 110, a word line 205, or a memory cell 105 to be accessed. In some examples, the FX decoder 420 may be referred to as a sub-word decoder, or a sub word line decoder. In some examples, the FX decoder 420 may determine which one of a set of memory cell groups is to be accessed, and whether certain outputs (e.g., logical signals) should be activated or deactivated. In one example, the FX decoder 420 may decode a set of bits (e.g., least significant bits) of the signal RowAdd to determine which portion of a memory section 110 is to be accessed, selected, or activated. In some examples, the FX decoder 420 may receive only the set of bits of a row address that are to be decoded by the FX decoder 420, or some other portion of a row address or memory cell address, which may include one or more bits and may be provided by a row address buffer (not shown).

The FX decoder 420 may provide two signals, FXF1 and FXT1, that are associated with the word line 205-b (e.g., $WL_1$), where the two signals FXF1 and FXT1 are based on decoding the received signal RowAdd. The signals FXF1 and FXT1 may be referred to as or indicate a sub-word-address. In the example of the FX decoder 420, FXF1 and FXT1 may have mutually opposite polarities or opposite logic states. In other words, when FXF1 has a relatively high potential (e.g., an activated potential, an activated logical signal), FXT1 has a relatively low potential (e.g., a deactivated potential, a deactivated logical signal), and vice versa. When the signal RowAdd indicates an address associated with the word line 205-b (e.g., $WL_1$), FXT1 may have a potential of Vccp (e.g., 3.1V, an activated logical signal) and FXF1 may have a ground potential (e.g., 0V, a deactivated logical signal). When the when the signal RowAdd does not indicate an address associated with the word line 205-b, FXT1 may have a ground potential (e.g., 0V, a deactivated logical signal) and FXF1 may have a potential of Vcc or Vccp (e.g., 1.6V, 3.1V, an activated logical signal). Thus, in various examples, the activated logical signal for FXF1 and the activated logical signal for FXT1 may have the same voltage level or different voltage levels. In some examples, one of the signals may indicate when a sub-word-address is selected or activated (e.g., where the signal FXT1 represents a "true" signal for a first sub-word-address of a set of sub-word-addresses), and the other of the signals may indicate when a sub-word-address is not selected or activated (e.g., where the signal FXF1 represents a "false" signal for the sub-word-address of the set of sub-word addresses).

The MW decoder 430 may also receive the signal RowAdd, or may receive some other portion of a row address. In some examples, the MW decoder 430 may determine which one of a set of memory cell groups is to be accessed, and whether certain outputs (e.g., logical signals) should be activated or deactivated. In some examples, the MW decoder 430 may be referred to as a main-word decoder, or a main word line decoder. In one example, the MW decoder 430 may decode a set of bits (e.g., a set of bits that are more significant than the least significant bits decoded by the FX decoder 420) of the signal RowAdd to determine which portion of a memory section 110 is to be accessed, selected, or activated. In some examples, the MW decoder 430 may receive only the set of bits of a row address that are to be decoded by the MW decoder 430, or some other portion of a row address, which may include one or more bits and may be provided by a row address buffer (not shown).

The MW decoder 430 may provide a logical signal MWLF1 that is associated with the word line 205-b (e.g., $WL_1$), where the signal MWLF1 is based on decoding the received signal RowAdd. When the signal RowAdd indicates an address associated with the word line 205-b, MWLF1 may have a ground potential (e.g., 0V, a deactivated logical signal) and when the when the signal RowAdd does not indicate an address associated with the word line 205-b, MWLF1 may have a potential of Vccp (e.g., 3.1V, an activated logical signal). In some examples, the signal MWLF1 may indicate when a main-word-address is not selected or activated (e.g., where the signal MWLF1 represents a "false" signal for a main-word-address of a set of main-word-addresses).

The word driver 440 may be configured to apply a voltage or bias to the word line 205-b based on the outputs (e.g., voltages, logical signals) of the FX decoder 420 and the MW decoder 430. For example, when the signal RowAdd indicates an address associated with the word line 205-b, the activated logical signal (e.g., Vccp, 3.1V) of FXT1 may be applied to the source of the p-type transistor 441, and the deactivated logical signal (e.g., 0V) of MWLF1 may be applied to the gate of the p-type transistor 441 to connect the signal FXT1 (e.g., connect the FX decoder 420, couple a selection or activation voltage source) with the word line 205-b (e.g., $WL_1$). Further, the deactivated logical signal of MWLF1 may also be applied to the gate of the n-type transistor 442 to isolate the signal VNWL_Loc1 (e.g., isolate the local VNWL controller 450) from the word line 205-b. In other words, when the signal RowAdd indicates an address associated with the word line 205-b, the word line 205-b may be activated with an activation voltage (e.g., Vccp, 3.1V).

When the signal RowAdd does not indicate an address associated with the word line 205-b, the activated logical signal (e.g., Vcc, Vccp, 1.6V, 3.1V) of FXF1 may be applied to the gate of the n-type transistor 443 to connect the signal VNWL_Loc1 with the word line 205-b. Further, the activated logical signal (e.g., Vccp, 3.1V) of MWLF1 may be applied to the gate of the p-type transistor 441 to isolate the signal FXT1 (e.g., isolate the FX decoder 420) from the word line 205-b, and may also be applied to the gate of the n-type transistor 442 to also connect the signal VNWL_Loc1 (e.g., couple the local VNWL controller 450) with the word line 205-b. In other words, when the signal RowAdd does not indicate an address associated with the word line 205-b, the word line 205-b may be coupled with the local VNWL controller 450. In other words, the word driver 440 may be an example of a selection component that, based on a row address signal (e.g., RowAdd, FXF1, FXT1, MWLF1), either selectively couples a word line with a selection or activation voltage (e.g., FXT1, Vccp, 3.1V) or voltage source (e.g., FX decoder 420), or selectively couples the word line with a deselection or deactivation voltage (e.g., VNWL) or voltage source (e.g., VNWL generator 410, local VNWL controller 450).

The local VNWL controller 450 may be configured to selectively couple or isolate the VNWL generator 410 (e.g., a voltage source) with the word driver 440. For example, when the word line 205-b is associated with a fault or defect (e.g., a fault 320 described with reference to FIG. 3, a short circuit), the local VNWL controller may selectively couple or isolate the VNWL generator 410 with the word driver 440 based on whether or not an access operation is being performed with another word line 205 (not shown). In other words, the local VNWL controller 450 or the circuit 400 may be an example of a circuit or memory controller configured to selectively couple or isolate a voltage source (e.g., VNWL generator 410) with a word line (e.g., the word line 205-b) or word driver 440. In some examples, the local VNWL controller 450 may receive a signal SecAct, which may provide an indication of whether an access operation is being performed with a word line 205 of a memory section 110 that includes the word line 205-b.

For example, when an access operation is being performed with another word line 205 of a memory section 110 that includes the word line 205-b (e.g., as indicated by a positive or activated logical value of the signal SecAct), the local VNWL controller 450 may couple the VNWL generator 410 with the word driver 440, which may accordingly couple (e.g., via the n-type transistor 442 or the n-type transistor 443) the VNWL generator 410 with the word line 205-b (e.g., $WL_1$). When an access operation is not being performed with another word line 205 of the memory section 110 that includes the word line 205-b (e.g., as indicated by a negative or deactivated logical value of the signal SecAct), the local VNWL controller 450 may isolate the VNWL generator 410 from the word driver 440. Thus, even when the n-type transistor 442 or the n-type transistor 443 of the word driver 440 are activated (e.g., when an access operation is not being performed using the word line 205-b), the VNWL generator 410 may be isolated from the word line 205-b. The word line 205-b may therefore be in a floating condition in some examples when an access operation is not being performed on the memory section 110 that includes the word line 205-b (e.g., when the signal SecAct has a negative or deactivated logical signal).

Figure 5:
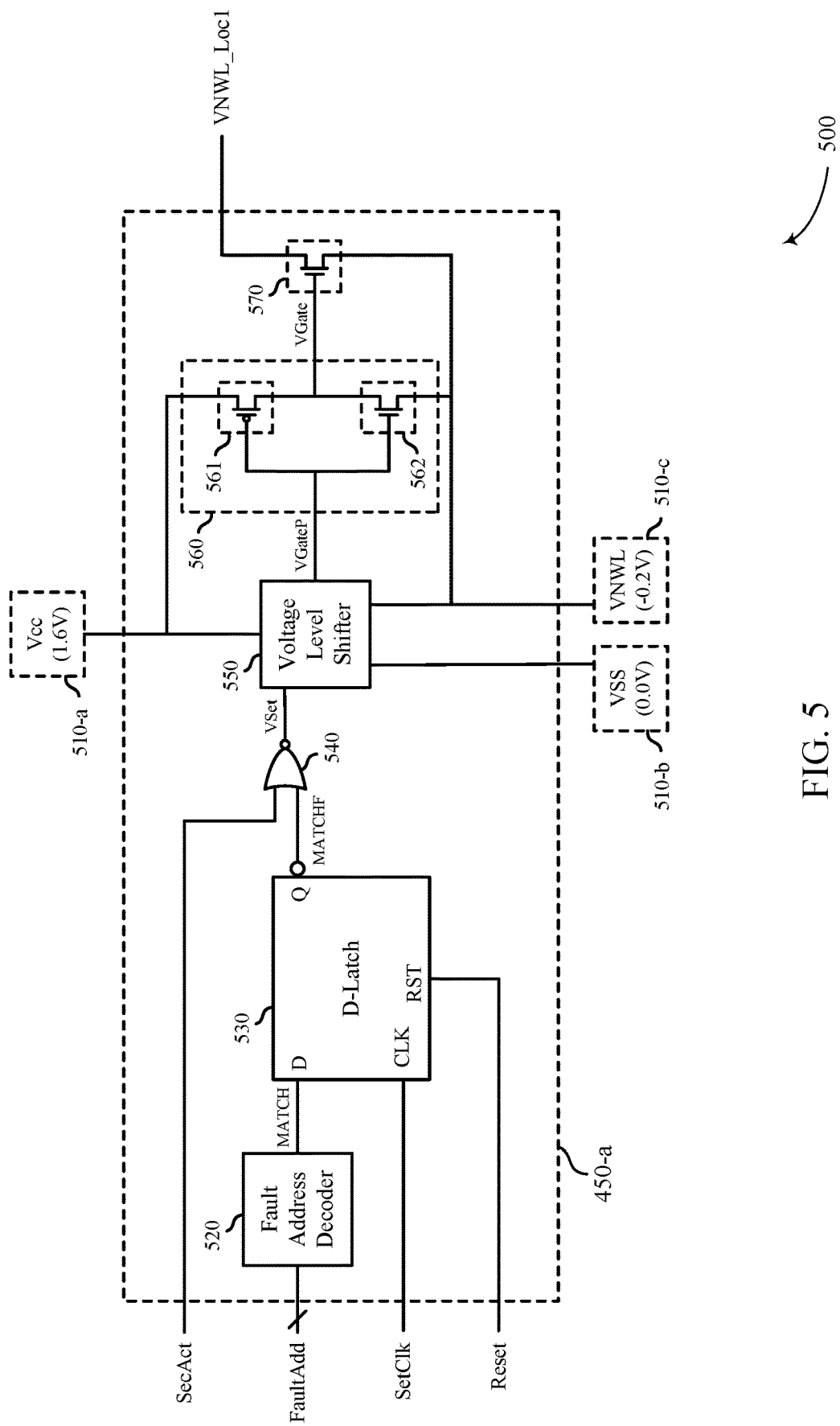
FIG. 5 illustrates an example of a local VNWL controller that supports access schemes for access line faults in a memory device in accordance with examples of the present disclosure.

FIG. 5 illustrates an example 500 of a local VNWL controller 450-a that supports access schemes for access line faults in a memory device in accordance with examples of the present disclosure. The local VNWL controller 450-a may be an example of local VNWL controller 450 described with reference to the circuit 400 of FIG. 4. The local VNWL controller 450-a may be an example of a circuit or memory controller configured to selectively couple or isolate a voltage source with a word line 205 (e.g., $WL_1$ as described with reference to FIGS. 3 and 4). The local VNWL controller 450-a may include a fault address decoder 520, a latch 530 (e.g., a volatile latch, a D-latch), a NOR gate 540, a voltage level shifter 550, an inverter 560, and an n-type transistor 570. In various examples, any one or more of the components of the local VNWL controller 450-a may be included in a row component 125 or a memory controller 170.

The local VNWL controller 450-a may receive various signals to support the described operations, including the signals illustrated in FIG. 5. A signal "SecAct" (e.g., a logical signal) may indicate whether an access operation is being performed on a memory section 110 (e.g., with an access line of the memory section 110, with a word line of the memory section 110) associated with the local VNWL controller 450-a. A signal "FaultAdd" may indicate one or more addresses (e.g., one or more access line addressed, one or more word line addresses, one or more row addresses) that are associated with a fault or defect (e.g., a short circuit) that was detected in a test of a memory device 100 and stored or otherwise configured in the memory device 100 (e.g., in a non-volatile storage or configuration of the memory device 100), or that was detected during the operation of the memory device 100 (e.g., by detecting anomalous behavior during the operation). A signal "SetClk" (e.g., a clock signal, a trigger signal) may be used to trigger or initiate various operations of the local VNWL controller 450-a. A signal "Reset" may be used to reset (e.g., initialize, reinitialize) various operations, conditions, or components of the local VNWL controller 450-a.

The local VNWL controller 450-a may be coupled with various voltage sources to support the described operations, including the voltage sources 510 illustrated in FIG. 5. A first voltage source 510-a may be a positive voltage source, and may be associated with a positive or activated logical signal (e.g., having a voltage Vcc=1.6V, an activated logical signal voltage). A second voltage source 510-b may be a ground voltage source (e.g., having a voltage Vss=0V, a chassis ground voltage, a first deactivated logical signal voltage). A third voltage source 510-c may be a negative voltage source (e.g., having a voltage VNWL=–0.2V, a second deactivated logical signal voltage). In various examples, the third voltage source 510-c may be associated with a second deactivated logical signal voltage, and may be associated with a negative deselection or deactivation word line voltage. In other words, under some conditions, the local VNWL controller 450-a may selectively couple the third voltage source 510-c with an output VNWL_Loc1 or isolate the third voltage source 510-c from the output VNWL_Loc1. In some examples, the third voltage source 510-c may be an example of or otherwise support the function of the VNWL generator 410 of the circuit 400 described with reference to FIG. 4.

The fault address decoder 520 may receive the signal FaultAdd, and determine whether the signal FaultAdd indicates a memory address associated with the local VNWL controller 450-a (e.g., a word line 205 or set of word lines 205 that may be coupled with the local VNWL controller 450-a, word line $WL_1$), and output a logical signal MATCH based on the determination. For example, if a word line 205 associated with the local VNWL controller 450-a is indicated in the signal FaultAdd, the signal MATCH may have a positive or activated logical signal (e.g., a positive voltage), and if a word line 205 associated with the local VNWL controller 450-*a* is not indicated in the signal FaultAdd, the signal MATCH may have a negative or deactivated logical signal (e.g., a ground voltage)

The latch 530 may latch a signal based at least in part on the input signal MATCH, which may be an example of latching a determination of whether the signal FaultAdd indicates a memory address associated with the local VNWL controller 450-*a*. For example, the latch 530 may receive the signal MATCH during a time interval and output signal MATCHF, and continue outputting the signal MATCHF even if the signal MATCH is dropped or removed after the time interval. In the example of local VNWL controller 450-*a*, the output signal MATCHF may have a different (e.g., opposite) value, polarity, or logical state from the input signal MATCH.

The voltage level shifter 550 may shift a level of an input signal VSet (e.g., a logical signal) under certain conditions. For example, when the input signal VSet is associated with a positive or activated logical state, the voltage level shifter 550 may maintain a voltage associated with the positive or activated logical state in the output signal VGateP (e.g., outputting VGateP at a voltage of Vcc when the input signal VSet is at a voltage of Vcc). When the input signal VSet is associated with a negative or deactivated logical state, the voltage level shifter 550 may shift a voltage associated with the negative or deactivated logical state in the output signal VGateP (e.g., outputting VGateP at a second deactivated logical signal voltage, such as VNWL, when the input signal VSet is at a first deactivated logical signal voltage, such as 0V). In some examples, the voltage level shifter 550 may support the operation of selectively coupling or isolating a negative voltage (e.g., of the third voltage source 510-*c*) with a word line 205 when using an n-type transistor as a switching component or switching element.

The inverter 560 may receive the signal VGateP to selectively couple either the first voltage source 510-*a* or the third voltage source 510-*c* with the gate of the n-type transistor 570. For example, the inverter 560 may include a p-type transistor 561 and an n-type transistor 562. When the signal VGateP has a positive or activated signal voltage (e.g., Vcc) the inverter 560 may output the signal VGate with a negative or deactivated signal voltage (e.g., VNWL), and when the signal VGateP has a negative or deactivated signal voltage (e.g., VNWL) the inverter 560 may output the signal VGate with a positive or activated signal voltage (e.g., Vcc). In some examples, the inverter 560 may be referred to as a selection component.

The n-type transistor 570 may support selectively coupling the third voltage source 510-*c* with the output signal VNWL_Loc0 or selectively isolating the third voltage source 510-*c* from the output signal VNWL_Loc0. The input signal VGate may be applied to a gate or gate node of the n-type transistor 570. For example, when the input signal VGate is a positive or activated signal (e.g., Vcc), the third voltage source 510-*c* may be coupled with the output of the local VNWL controller 450-*a* (e.g., providing VNWL_Loc0 with a voltage equal to VNWL=−0.2V). When the input signal VGate is a negative or deactivated signal (e.g., VNWL), the third voltage source 510-*c* may be isolated from the output of the local VNWL controller 450-*a* (e.g., floating the output VNWL_Loc0, disconnecting a word driver from the third voltage source 510-*c*).

In some examples, the n-type transistor 570 may be referred to as a switching component, and may support selectively coupling an access line (e.g., $WL_1$) with a voltage source (e.g., the third voltage source 510-*c*) or selectively isolating the access line from the voltage source. In some examples, the local VNWL controller 450-*a* may be referred to as a switching component or switching controller, or be included in a larger circuit that is referred to as a switching component or switching controller (e.g., including a word driver 440), where the switching (e.g., of the n-type transistor 570 to selectively isolate or couple the third voltage source 510-*c* with the output of the local VNWL controller 450-*a*) is based at least in part on one or more of the signals SecAct, FaultAdd, SetClk, or Reset.

Figure 6:
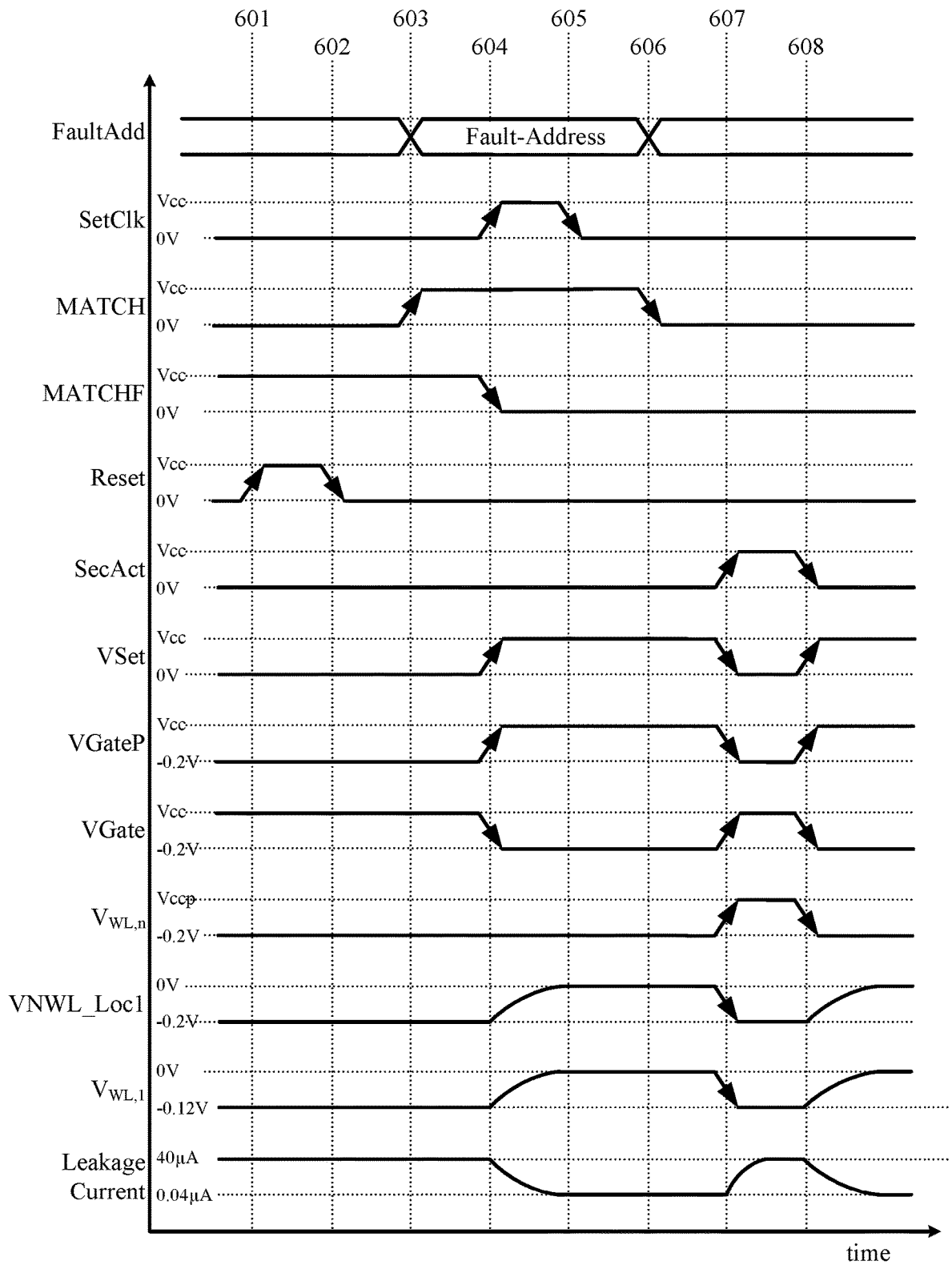
FIG. 6 shows a timing diagram illustrating operations of an example access scheme for access line faults in a memory device in accordance with various embodiments of the present disclosure.

FIG. 6 shows a timing diagram 600 illustrating operations of an example access scheme for access faults in a memory device in accordance with examples of the present disclosure. The timing diagram 600 is described with reference to components of the example local VNWL controller 450-*b* described with reference to FIG. 5, but may be illustrative of operations that may be performed with different circuit arrangements as well. In the example of timing diagram 600, a word line 205 associated with the local VNWL controller 450-*b* (e.g., $WL_1$ described with reference to FIGS. 3 and 4) may be associated with a fault or defect (e.g., a short circuit). The timing diagram 600 may illustrate an example of selectively isolating and coupling a word line 205 with a voltage source (e.g., third voltage source 510-*c*) during a period when the word line is deselected (e.g., a deselection period of the word line, a standby period of the word line).

Prior to the operations of timing diagram 600, the output of the local VNWL controller 450-*a* may be coupled with the third voltage source 510-*c*, which may be an example where the word line $WL_1$ is coupled with a negative deselection or deactivation voltage. Further, the digit line $DL_1$ may be coupled with a ground voltage source. Thus, a current or charge (e.g., a leakage current or charge, a current or charge that is above a threshold) may flow across a fault or defect between access the word line $WL_1$ and the digit line $DL_1$ (e.g., fault 320 as described with reference to FIG. 3). An example of such a current between the word line $WL_1$ and the digit line $DL_1$ is illustrated by the plot of "Leakage Current" illustrated in the timing diagram 600, where the initial leakage current between the word line $WL_1$ and the digit line $DL_1$ may be 40 µA (e.g., in the case when the fault 320 is associated with a 5 kOhm resistance, and a voltage difference across the fault 320 is 0.2V).

Although the voltage of VNWL_Loc1 (e.g., at the output of the local VNWL controller 450-*a*) may be approximately equal to the voltage level of the third voltage source 510-*c* (e.g., −0.2V), the voltage of the word line $WL_1$ (e.g., $V_{WL,1}$) may be between the ground voltage of the digit line $DL_1$ (e.g., $V_{DL,1}$, a ground voltage) and the negative voltage of the third voltage source 510 (e.g., −0.2V) because of the voltage drop associated with the current flowing between the digit line $DL_1$ and the word line $WL_1$ (e.g., across the fault 320). For example, the initial voltage of the word line $WL_1$ may be −0.12V, as illustrated. Other deselected or deactivated word lines 205 (e.g., another word line, $WL_n$, associated with the same memory section 110, not associated with faults 320) may be held at a voltage equal to the deselection or deactivation voltage (e.g., $V_{WL,n}$ having an initial voltage of −0.2V).

At 601, the signal Reset may transition from a deactivated voltage (e.g., 0V) to an activated voltage (e.g., Vcc). In other words, at 601, the signal Reset may transition to an activated state. In response, the latch 530 may transition to an unlatched or otherwise initialized state (e.g., clearing a latched value).

At 602, the signal Reset may transition from a deactivated voltage (e.g., 0V) to an activated voltage (e.g., Vcc). In other words, at 602 the signal Reset may transition to a deactivated state. In response, the latch 530 may be in an idle state that will respond to (e.g., latch) an input signal (e.g., upon receiving a latch initiation signal).

At 603, the signal FaultAdd may change state, or the local VNWL controller 450-*a* may receive or otherwise decode the signal FaultAdd. For example, at 603, the fault address decoder 520 may receive the signal FaultAdd and determine or identify whether the word line 205 associated with the local VNWL controller 450-*a* is associated with a fault or defect (e.g., a short circuit). Because, in the example of timing diagram 600, the word line 205 (e.g., $WL_1$) associated with the local VNWL controller 450-*a* is associated with a fault or defect (e.g., fault 320 described with reference to FIG. 3), the fault address decoder 520 may output an activated signal MATCH (e.g., based on identifying that the word line $WL_1$ is associated with the fault 320). In other words, because one or more of the word lines 205 associated with the local VNWL controller 450-*a* may be associated with a fault or defect, the signal MATCH may transition from a deactivated voltage (e.g., 0V) to an activated voltage (e.g., Vcc) at 603. In other examples (e.g., for a local VNWL controller 450 that does not include a word line 205 associated with a fault or defect), the signal MATCH may remain in a deactivated state after 603.

At 604, the signal SetClk may transition from a deactivated voltage (e.g., 0V) to an activated voltage (e.g., Vcc). In other words, at 604, the signal SetClk may transition to an activated state. In response, the latch 530 may latch an output signal (e.g., MATCHF) based at least in part on the input signal (e.g., MATCH) and a latch initiation signal (e.g., SetClk). In other words, the latch 530 may latch a value of the determination (e.g., by the fault address decoder 520) that the word line $WL_1$ is indicated in the signal SecAct. In the example of local VNWL controller 450-*a*, the latched output signal may have a polarity or state that is opposite from the polarity of state of the input signal. Thus, because the signal MATCH has an activated voltage (e.g., Vcc), the output signal MATCHF may transition from an activated voltage (e.g., Vcc) to a deactivated voltage (e.g., 0V, an opposite logical signal from MATCH).

The latch 530 may maintain the value of the output signal MATCHF until receiving another latch initiation signal (e.g., a transition of the signal SetClk from a deactivated voltage to an activated voltage, another operational cycle that identifies whether access lines are associated with faults or defects) or until the latch 530, the local VNWL controller 450-*a*, or the memory device 100 that includes the local VNWL controller 450-*a* is powered down. In other words, the latch 530 may store a comparison of an address of the word line $WL_1$ with a signal (e.g., FaultAdd) indicating memory addresses associated with faults. In various examples, any one or more of the operations described above with reference to 601 through 604 may be referred to as determining whether an access line (e.g., a word line 205), such as an access line associated with the local VNWL controller 450-*a*, is associated with a fault or defect, or identifying that a word line 205 is associated with a fault or defect.

When the signal MATCHF transitions from the activated voltage to the deactivated voltage, the output of the NOR gate 540 (e.g., signal VSet) may transition from a deactivated voltage (e.g., 0V) to an activated voltage (e.g., Vcc) because neither the signal MATCHF nor the signal SecAct are activated. Accordingly, the signal VGateP may also transition from a deactivated voltage (e.g., VNWL, −0.2V) to an activated voltage (e.g., Vcc). The transition of the signal VGateP to an activated voltage may accordingly cause the output of the inverter 560, the signal VGate, to transition from an activated voltage (e.g., Vcc) to deactivated voltage (e.g., VNWL, −0.2V).

As a result of the above operations at 604, the n-type transistor 570 may be deactivated, which may cause the third voltage source 510-*c* to be decoupled or isolated from the output of the local VNWL controller 450-*a* (e.g., VNWL_Loc0). Thus, one or more of the operations of 604 may be an example of isolating a word line 205 from a voltage source (e.g., the third voltage source 510-*c*) during a portion of a period when the word line 205 is deselected, or isolating the word line 205 from a voltage source during a period of a standby state of the word line 205. Moreover, because the signal SecAct is at a deactivated voltage, one or more of the operations of 604 may also be an example of isolating an access line (e.g., word line 205) from a voltage source based at least in part on a signal (e.g., signal SecAct) indicating that the access operation is not being performed.

Because the output of the local VNWL controller 450-*a* is electrically isolated from the third voltage source 510-*c* as a result of the operations of 604, the difference in voltage between the word line $WL_1$ and the digit line $DL_1$ may collapse as charge is shared between the two access lines (e.g., across the fault 320). In other words, the voltage of the output of the local VNWL controller 450-*b* (e.g., the voltage of VNWL_Loc1), and also the voltage of the word line $WL_1$ (e.g., $V_{WL,1}$), may increase to meet the voltage of the digit line $DL_1$, which may be illustrative of a digit line standby voltage. Thus, a current or charge between the word line $WL_1$ and the digit line $DL_1$ may dissipate or otherwise drop below a leakage threshold (e.g., reaching or approaching zero current, satisfying a standby current threshold). As illustrated by the plot of Leakage Current, the leakage current between the word line $WL_1$ and the digit line $DL_1$ may collapse to a value of 0.04 µA (e.g., as charge is shared between the word line $WL_1$ and the digit line $DL_1$), which may represent an acceptable amount of standby current for a memory device that includes the described circuits.

At 605, the signal SetClk may transition from an activated voltage (e.g., Vcc) to a deactivated voltage (e.g., 0V). In other words, at 601, the signal SetClk may transition to a deactivated state.

At 606, the signal FaultAdd may change state, or the local VNWL controller 450-*a* may stop receiving or otherwise decoding the signal FaultAdd. For example, at 606, the fault address decoder 520 may output a deactivated signal MATCH. However, because of the latched output of the latch 530, the signal MATCHF may remain at the deactivated state after 606.

At 607, an access operation may be performed with another word line 205 (e.g., word line $WL_n$) of the memory section 110 that includes the word line 205 that is associated with the fault or defect (e.g., $WL_1$). In some examples, the access operation may be performed with a word line 205 of the memory section 110 that intersects one or more digit lines 210 that also intersect the word line 205 that is associated with the fault or defect (e.g., $WL_1$ associated with the fault 320). Thus, at 607, the word line being accessed may be activated or selected with an activation or selection voltage (e.g., $V_{WL,n}$ being biased to a voltage Vccp). Further, at 607, the signal SecAct may transition from a deactivated voltage (e.g., 0V) to an activated voltage (e.g., Vcc). In other words, at 607, the signal SecAct may transition to an activated state, indicating that an access operation is being performed using another word line 205 (e.g., of the same memory section).

When the signal SecAct transitions from the deactivated voltage to the activated voltage, the output of the NOR gate 540 (e.g., signal VSet) may transition from an activated voltage (e.g., Vcc) to a deactivated voltage (e.g., 0V). Accordingly, the signal VGateP may also transition from an activated voltage (e.g., Vcc) to a deactivated voltage (e.g., –0.2V). The transition of the signal VGateP to a deactivated voltage may cause the output of the inverter 560, the signal VGate, to transition from a deactivated voltage (e.g., –0.2V) to an activated voltage (e.g., Vcc).

As a result of the above operations at 607, the n-type transistor 570 may be activated, which may in some cases couple the third voltage source 510-$c$ with the output of the local VNWL controller 450-$a$ (e.g., VNWL_Loc0). Thus, one or more of the operations of 607 may be an example of coupling a word line 205 (e.g., $WL_1$) with a voltage source (e.g., the third voltage source 510-$c$) during a portion of a period when the word line 205 is deselected, or coupling the word line 205 with a voltage source during a period of a standby state of the word line 205. Moreover, because the signal SecAct is at an activated voltage, one or more of the operations of 607 may also be an example of coupling an access line (e.g., word line $WL_1$) with a voltage source based at least in part on a signal (e.g., signal SecAct) indicating that an access operation is being performed.

Because the output of the local VNWL controller 450-$a$ is coupled with the third voltage source 510-$c$ as a result of the operations of 607, the conditions following 607 may be another example where the word line $WL_1$ is coupled with a negative deselection or deactivation voltage. Further, the digit line $DL_1$ may be also coupled with a ground voltage source during the access operation. Thus, a current or charge may again flow across the fault or defect between access the word line $WL_1$ and the digit line $DL_1$. As illustrated by the plot of Leakage Current, the leakage current between the word line $WL_1$ and the digit line $DL_1$ may change (e.g., rise) as a result of the operations of 607, where the leakage current between the word line $WL_1$ and the digit line $DL_1$ may rise to 40 µA (e.g., equal to or similar to the initial leakage current, prior to isolating the third voltage source 510-$c$ from the word line $WL_1$).

Further, the voltage of the word line $WL_1$ (e.g., $V_{WL,1}$) may again be between the ground voltage of the digit line $DL_1$ (e.g., $V_{DL,1}$, a ground voltage) and the negative voltage of the third voltage source 510 (e.g., –0.2V). However, the illustrated word line voltage $V_{WL,1}$ of –0.12V after 607 may be sufficient to effectively deselect or deactivate the cell selection components 230 or memory cells 105 (e.g., of the row associated with the word line $WL_1$) that are not included in the access operation. Thus, the operations of 607 may prevent multiple memory cells 105 (e.g., capacitors 220) from being coupled with a respective digit line 210. Accordingly, the information of the one or more memory cells 105 being accessed can be safely read out onto respective digit lines, with a reduced occurrence of collisions against the memory cells 105 being accessed.

At 608, the access operation (e.g., as initiated at 607) may be completed with the other word line 205. Thus, at 608, the word line being accessed may be deactivated or deselected with a deactivation or deselection voltage (e.g., $V_{WL,n}$ being biased to a –0.2V). Further, at 608, the signal SecAct may transition from an activated voltage (e.g., Vcc) to a deactivated voltage (e.g., 0V). In other words, at 608, the signal SecAct may transition to a deactivated state.

When the signal SecAct transitions from the activated voltage to the deactivated voltage, the output of the NOR gate 540 (e.g., signal VSet) may transition from a deactivated voltage (e.g., 0V) to an activated voltage (e.g., Vcc). Accordingly, the signal VGateP may also transition from a deactivated voltage to an activated voltage. The transition of the signal VGateP to an activated voltage may accordingly cause the output of the inverter 560, the signal VGate, to transition from an activated voltage to a deactivated voltage.

As a result of the above operations at 608, the n-type transistor 570 may again be deactivated, which may decouple or isolate the third voltage source 510-$c$ from the output of the local VNWL controller 450-$a$ (e.g., VNWL_Loc0). Thus, one or more of the operations of 608 may be an example of decoupling or isolating a word line 205 with a voltage source (e.g., the third voltage source 510-$c$) during a portion of a period when the word line 205 is deselected, or decoupling or isolating the word line 205 from a voltage source during a period of a standby state of the word line 205. Moreover, because the signal SecAct is at a deactivated voltage, one or more of the operations of 608 may also be an example of decoupling or isolating an access line (e.g., word line 205) with a voltage source based at least in part on a signal (e.g., signal SecAct) indicating that an access operation is not being performed.

Because the output of the local VNWL controller 450-$a$ is isolated from the third voltage source 510-$c$ as a result of the operations of 608, the difference in voltage between the word line $WL_1$ and the digit line $DL_1$ may again collapse as charge is shared between the two access lines (e.g., across the fault 320). In other words, the voltage of the output of the local VNWL controller 450-$b$ and also the voltage of the word line $WL_1$ may increase to meet the voltage of the digit line $DL_1$, which may be illustrative of a digit line standby voltage. Thus, a current or charge between the word line $WL_1$ and the digit line $DL_1$ may again dissipate or otherwise drop below a leakage threshold (e.g., reaching or approaching zero current, satisfying a standby current threshold). As illustrated by the plot of Leakage Current, as one example, the leakage current between the word line $WL_1$ and the digit line $DL_1$ may again collapse to a value of 0.04 µA (e.g., as charge is shared between the word line $WL_1$ and the digit line $DL_1$), which may represent an acceptable amount of standby current for a memory device that includes the described circuits.

Although a single access operation is shown (e.g., the access operation associated with 607 and 608), subsequent access operations may be performed without repeating various initialization operations described with reference to the timing diagram 600. For example, following the operations of 608, another access operation may be performed with another word line 205 (e.g., word line $WL_n$) of the memory section 110 that includes the word line 205 associated with the fault or defect. Thus, the combined operations of 607 and 608 that relate to the local VNWL controller 450-$a$ may be repeated for various other access operations (e.g., when accessing the word line $WL_n$ or another word line of the same memory section 110), and may omit one or more of the operations of 601 through 606 (e.g., as supported by the latched signal MATCHF from the latch 530).

The operations or conditions between 607 and 608 that relate to the local VNWL controller 450-$a$ may be illustrative of coupling the word line $WL_1$ with the third voltage source 510-$c$ based at least in part on the signal SecAct indicating that an access operation is being performed. The operations between 608 and a subsequent repeat of the operations of 607 operations (e.g., when accessing the word line $WL_n$ or another word line 205 of the same memory section 110) may be illustrative of isolating the word line WL₁ from the third voltage source 510-c based at least in part on the signal SecAct indicating that an access operation is not being performed The order of operations shown in the timing diagram 600 is for illustration only, and various other orders and combinations of steps may be performed in accordance with the present disclosure. Further, the timing of the operations of the timing diagram 600 is also for illustration purposes only, and is not meant to indicate a particular relative duration between one operation and another. Various operations may occur over a duration or time interval that is relatively shorter or relatively longer than illustrated in various embodiments of access schemes for activity-based data protection in a memory device in accordance with the present disclosure.

The transitions of the logical signals of the timing diagram 600 are illustrative of transitions from one state to another, and may reflect transitions between a disabled or deactivated state (e.g., state "0") and an enabled or activated state (e.g., state "1") as associated with a particular numbered operation. In some examples, the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over time from one logical state to another.

In some examples, the transition of a component from one state to another may be based on characteristics of the associated logical signal, including the voltage level of the logical signal or the transition characteristics of the logical signal itself. Thus, the transitions shown in the timing diagram 600 are not necessarily indicative of an instantaneous transition. Further, the initial state of a logical signal associated with a transition at a numbered operation may have been arrived during various times preceding the numbered operation while still supporting the described transitions and associated operations. Although logical signals are described as a transition between logical states, the voltage of a logical signal may be selected to operate a component at a particular working point (e.g., in an active region or in a saturation region), and may be the same as, or different from a voltage of other logical signals.

Figure 7:
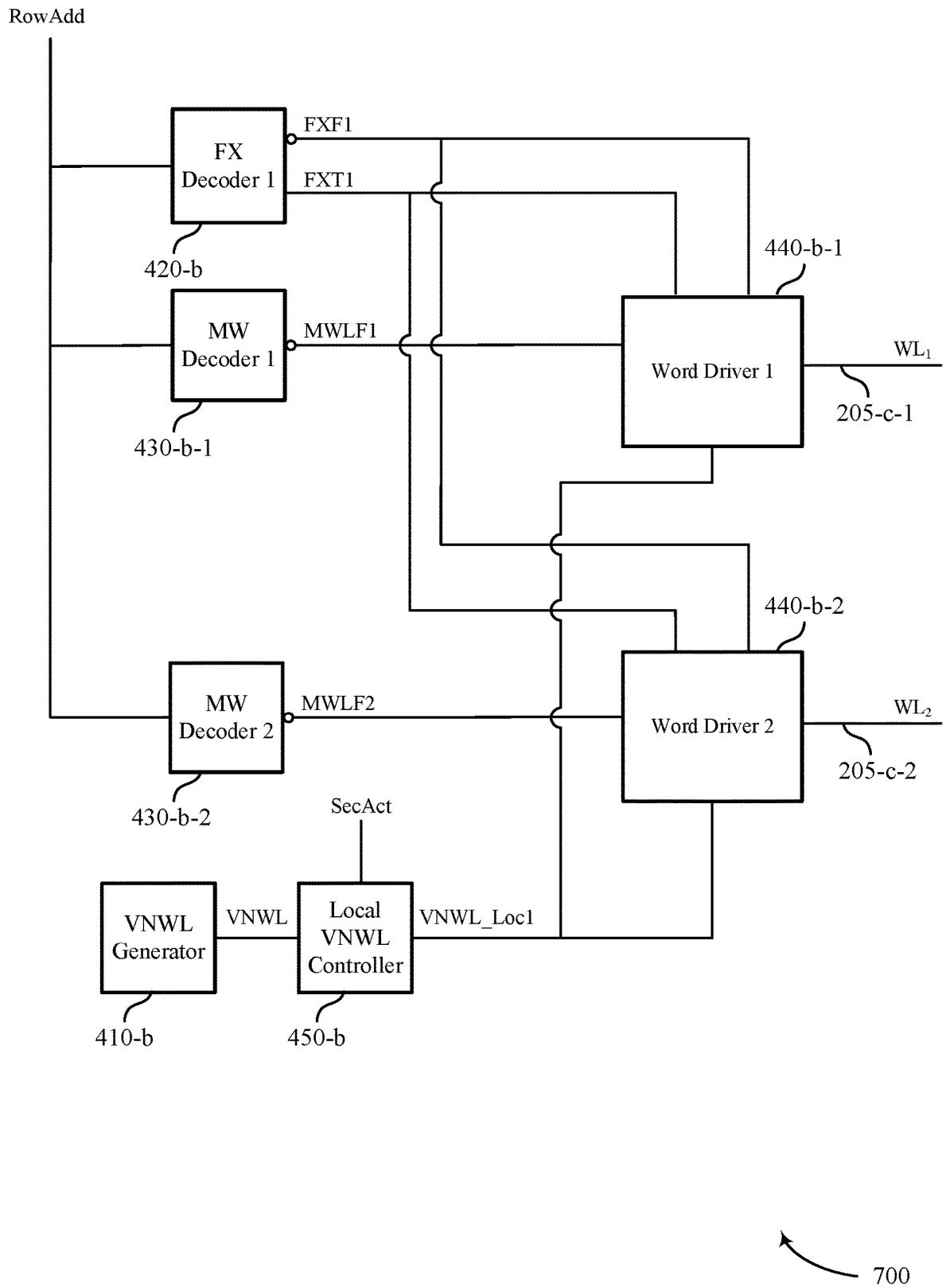
FIG. 7 illustrates an example circuit that supports access schemes for access line faults in a memory device in accordance with examples of the present disclosure.

FIG. 7 illustrates an example circuit 700 that supports access schemes for access line faults in a memory device in accordance with various embodiments of the present disclosure. The circuit 700 may be an example of or included in a circuit or a memory controller configured to drive or bias a word line 205-c-1 and a word line 205-c-2 (e.g., WL₁ and WL₂ described with reference to circuit 300 of FIG. 3) with a voltage (e.g., a selection or deselection voltage, an activation or deactivation voltage). The circuit 700 includes a VNWL generator 410-b, an FX decoder 420-b, a first MW decoder 430-b-1, a second MW decoder 430-b-2, a first word driver 440-b-1 a second word driver 440-b-2 and a local VNWL controller 450-b. In various examples, any one or more of the components of the circuit 400 may be included in a row component 125 or a memory controller 170. The circuit 700 shows an example where the Local VNWL controller 450-b may be shared by multiple word lines 205, or be common to multiple word lines 205.

The VNWL generator 410-b may be an example of VNWL generator 410 described with reference to FIG. 4, and may provide a voltage that is associated with deselecting or deactivating a word line 205.

The FX decoder 420-b may be an example of the FX decoder 420 described with reference to FIG. 4, and may receive a signal RowAdd, which may indicate an address of a memory section 110, a portion of a memory section 110, a word line 205, or a memory cell 105 to be accessed. In some examples, the FX decoder 420-b may determine which one of a set of memory cell groups is to be accessed, and whether certain outputs (e.g., logical signals) should be activated or deactivated. In one example, the FX decoder 420-b may decode a set of bits (e.g., least significant bits) of the signal RowAdd to determine which portion of a memory section 110 is to be accessed, selected, or activated. In some examples, the portion of the memory section 110 to be accessed, or the portion of the signal RowAdd to be decoded by the FX decoder 420-b, may be common to the word line 205-c-1 and the word line 205-c-2 (e.g., common to the MW decoders 430-b and 430-c, common to the word line drivers 440-b and 440-c).

The FX decoder 420-b may provide signals, such as FXF1 and FXT1, that may be associated with or otherwise common to both the word line 205-b and the word line 205-c (e.g., WL₁ and WL₂), where the two signals FXF1 and FXT1 may be based on decoding the received signal RowAdd. In the example of the FX decoder 420-b, FXF1 and FXT1 may have mutually opposite polarities. When the signal RowAdd indicates an address associated with either one or both of the word line 205-b and 205-c, FXT1 may have a potential of Vccp (e.g., 3.1V, an activated logical signal) and FXF1 may have a ground potential (e.g., 0V, a deactivated logical signal). When the when the signal RowAdd does not indicate an address associated with either the word line 205-b or the word line 205-c, FXT1 may have a ground potential (e.g., 0V, a deactivated logical signal) and FXF1 may have a potential of Vcc or Vccp (e.g., 1.6V, 3.1V, an activated logical signal).

The MW decoders 430-b-1 and 430-b-2 may be examples of the MW decoder 430 described with reference to FIG. 4, and may also receive the signal RowAdd or some other portion of a row address. In some examples, the MW decoders 430-b-1 and 430-b-2 may determine which one of a set of memory cell groups is to be accessed, and whether certain outputs (e.g., logical signals) should be activated or deactivated. In one example, the MW decoders 430-b-1 and 430-b-2 may decode a set of bits (e.g., a set of bits that are more significant than the least significant bits decoded by the FX decoder 420-b) of the signal RowAdd to determine which portion of a memory section 110 is to be accessed, selected, or activated.

The first MW decoder 430-b-1 may provide a logical signal MWLF1 that is associated with the word line 205-c-1 (e.g., WL₁), where the signal MWLF1 is based on decoding the received signal RowAdd. When the signal RowAdd indicates an address associated with the word line 205-c-1, MWLF1 may have a ground potential (e.g., 0V, a deactivated logical signal) and when the when the signal RowAdd does not indicate an address associated with the word line 205-c-1, MWLF1 may have a potential of Vccp (e.g., 3.1V, an activated logical signal).

The second MW decoder 430-b-2 may provide a logical signal MWLF2 that is associated with the word line 205-c-2 (e.g., WL₂), where the signal MWLF2 is based on decoding the received signal RowAdd. When the signal RowAdd indicates an address associated with the word line 205-c-2, MWLF1 may have a ground potential (e.g., 0V, a deactivated logical signal) and when the when the signal RowAdd does not indicate an address associated with the word line 205-c-2, MWLF1 may have a potential of Vccp (e.g., 3.1V, an activated logical signal).

The word drivers 440-b-1 and 440-b-2 may be examples of the word driver 440 described with reference to FIG. 4, and may be configured to apply a voltage or bias to respective word lines 205-c based on the outputs (e.g., voltages, logical signals) of the FX decoder 420-b and one of the MW decoders 430-b-1 or 430-b-2.

For example, when the signal RowAdd indicates an address associated with the word line 205-c-1, the word driver 440-b-1 may connect the signal FXT1 with the word line 205-c-1, and isolate the signal VNWL_Loc1 from the word line 205-c-1. In other words, when the signal RowAdd indicates an address associated with the word line 205-c-1, the word driver 440-b-1 may activate the word line 205-c-1 with an activation voltage. When the signal RowAdd does not indicate an address associated with the word line 205-c-1, the word driver 440-b-1 may isolate the signal FXT1 from the word line 205-c-1, and couple the signal VNWL_Loc1 with the word line 205-c-1. In other words, when the signal RowAdd does not indicate an address associated with the word line 205-c-1 the word driver 440-b-1 may couple the word line 205-c-1 with the local VNWL controller 450-b.

In another example, when the signal RowAdd indicates an address associated with the word line 205-c-2, the word driver 440-b-2 may connect the signal FXT1 with the word line 205-c-2, and isolate the signal VNWL_Loc1 from the word line 205-c-2. In other words, when the signal RowAdd indicates an address associated with the word line 205-c-2, the word driver 440-b-2 may activate the word line 205-c-2 with an activation voltage. When the signal RowAdd does not indicate an address associated with the word line 205-c-2, the word driver 440-b-2 may isolate the signal FXT1 from the word line 205-c-2, and couple the signal VNWL_Loc1 with the word line 205-c-2. In other words, when the signal RowAdd does not indicate an address associated with the word line 205-c-2 the word driver 440-b-2 may couple the word line 205-c-2 with the local VNWL controller 450-b.

The local VNWL controller 450-b may be an example of the local VNWL controllers 450 described with reference to FIGS. 4 and 5, and may be configured to selectively couple or isolate the VNWL generator 410-b (e.g., a voltage source) with both the word driver 440-b-1 and the word driver 440-b-2 (e.g., a common or shared coupling, a common or shared isolation). For example, when either one or both of the word line 205-c-1 and 205-c-2 is associated with a fault or defect (e.g., a fault 320 described with reference to FIG. 3, a short circuit), the local VNWL controller 450-b may selectively couple or isolate the VNWL generator 410 with both the word drivers 440-b-1 and 440-b-2 based on whether or not an access operation is being performed with another word line 205 (not shown).

In other words, the local VNWL controller 450-b or the circuit 700 may be an example of a circuit or memory controller configured to selectively couple or isolate a voltage source (e.g., VNWL generator 410-b) with a set of word lines 205 (e.g., the word lines 205-c-1 and 205-c-2) or a set of word drivers 440 (e.g., word drivers 440-b-1 and 440-b-2). In some examples, the local VNWL controller 450-b may receive a signal SecAct, which may provide an indication of whether an access operation is being performed with a word line 205 of a memory section 110 that includes the word lines 205-c-1 and 205-c-2.

For example, when an access operation is being performed with another word line 205 of a memory section 110 that includes the word lines 205-c-1 and 205-c-2 (e.g., as indicated by a positive or activated logical value of the signal SecAct), the local VNWL controller 450-b may couple the VNWL generator 410-b with both of the word drivers 440-b-1 and 440-b-2, which may accordingly couple the VNWL generator 410 with one of the word lines 205-c-1 or 205-c-2 (e.g., when the other of the word lines 205-c-1 or 205-c-2 is being accessed) or both of the word lines 205-c-1 and 205-c-2 (when neither of the word lines 205-c-1 or 205-c-2 are being accessed).

When an access operation is not being performed with another word line 205 of the memory section 110 that includes the word lines 205-c-1 and 205-c-2 (e.g., as indicated by a negative or deactivated logical value of the signal SecAct), the local VNWL controller 450-b may isolate the VNWL generator 410-b from both of the word drivers 440-b-1 and 440-b-2, which may accordingly isolate the word lines 205-c-1 and 205-c-2 from the VNWL generator 410-b. Thus, the word lines 205-c-1 and 205-c-2 may be in a floating condition when an access operation is not being performed on the memory section 110 that includes the word lines 205-c-1 and 205-c-2 (e.g., when the signal SecAct has a negative or deactivated logical signal).

In some examples, the implementation of circuit 700 may provide certain advantages over the implementation of circuit 400. For example, by associating the local VNWL controller 450-b with multiple word drivers 440 (e.g., word drivers 440-b-1 and 440-b-2) or multiple word lines 205 (e.g., word lines 205-c-1 and 305-c-2) according to the implementation of circuit 700, a number of local VNWL controllers 450 in a memory device 100 may be reduced as compared with a memory device that associates local VNWL controllers 450 with a single word driver 440 or a single word line 205. However, in the implementation of circuit 700, a greater number of word lines 205 may need to be replaced with redundancy word lines 205 when a fault 320 exists.

In other words, a memory device 100 that implements local VNWL controllers 450 that are each associated with multiple word lines 205 or multiple word drivers 440 may require a greater number of redundant word lines 205 to accommodate faults 320 (e.g., by replacing faulted word lines 205 with non-faulted word lines 205 during operation of the memory device 100) than another memory device 100 that implements local VNWL controllers 450 that are each associated with a single word line 205 or a single word driver 440. Thus, a number of word lines 205 or a number of word drivers 440 that are associated with a given local VNWL controller 450 in a particular implementation of a memory device 100 is a design tradeoff that may be considered for particular applications.

Although the examples of circuits 400 and 700 illustrate word drivers 440 that are associated with a single word line 205, other examples of word drivers in accordance with the present disclosure may be associated with multiple word lines 205. In one example, each word driver 440 may be associated with 8 word lines 205, and such a word driver 440 may receive FXF signals and FXT signals that are associated with 8 row addresses (e.g., denoted as FXF<7:0> and FXT<7:0>). Thus, the described operations for selectively coupling or isolating word lines 205 or word drivers 440 with a voltage source (e.g., a VNWL generator 410) may be performed or configured according to different groups or multiples of word lines 205 or different groups or multiples of word drivers 440.

Figure 8:
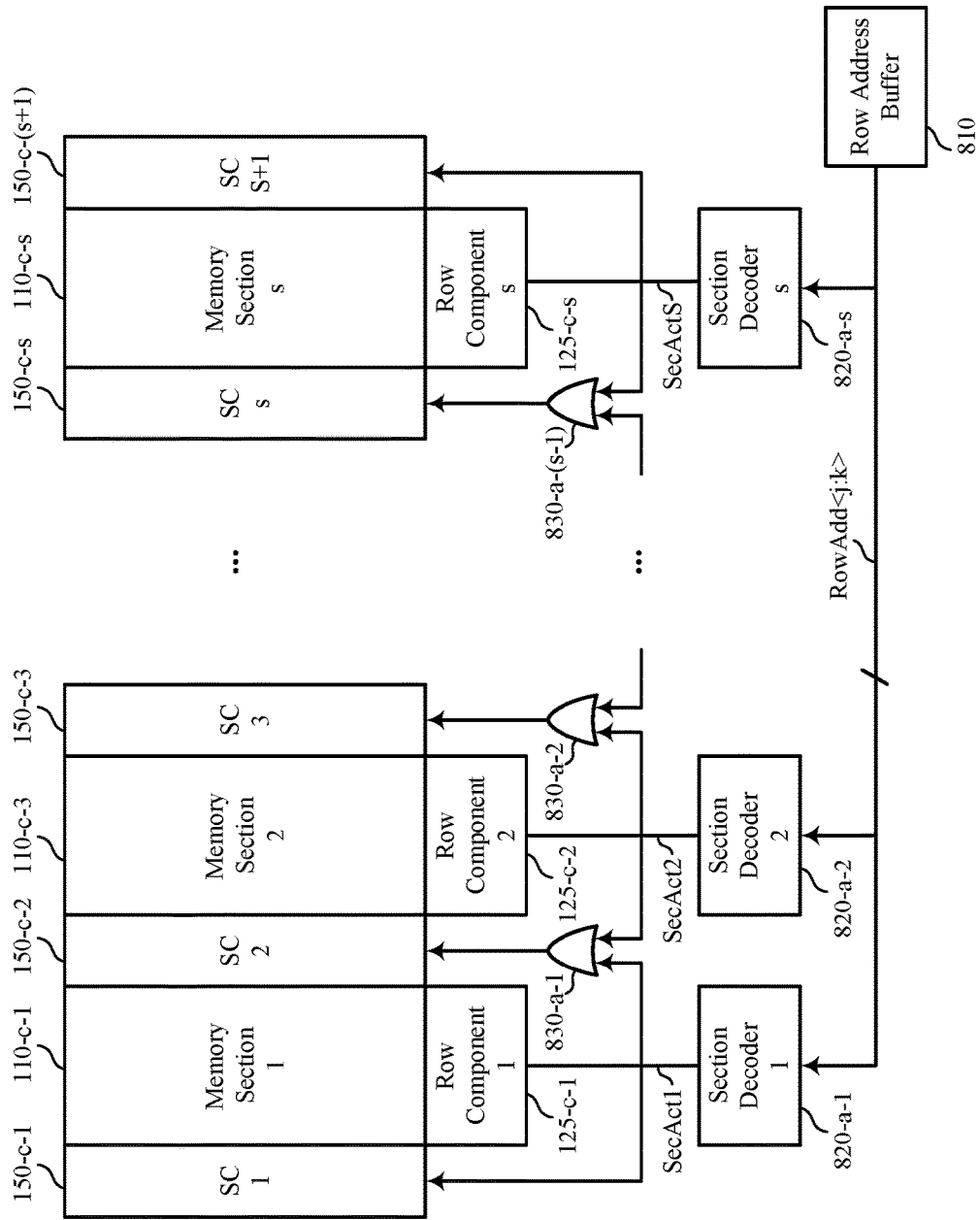
FIG. 8 shows a block diagram illustrating an arrangement of a memory array that may support access schemes for access line faults in a memory device in accordance with various embodiments of the present disclosure.

FIG. 8 shows a block diagram illustrating an arrangement of a memory array 800 that may support access schemes for access line faults in a memory device in accordance with various embodiments of the present disclosure. The memory array 800 may illustrate an arrangement of components that support identifying a memory section 110 of a set of memory sections that is associated with a particular access operation, and providing an indication to various components of the memory array 800 (e.g., a row component 125) that the identified memory section is associated with the access operation.

The memory array 800 includes a set of S memory sections 110-c (e.g., memory sections 110-c-1 through 110-c-s) that are each associated with a respective row component 125-c (e.g., row components 125-c-1 through 125-c-s). Each of the memory sections 110-c may be an example of memory sections 110 described herein, and each of the row components 125-c may be an example of row components 125 described herein. Each of the memory sections 110-c may be associated with a set of word lines 205 and a set of digit lines 210. In some examples, the set of word lines 205 of one memory section 110-c may be electrically isolated or uniquely accessible from the set of word lines 205 of another memory section. In some examples, the set of digit lines 210 of one memory section 110-c may be electrically isolated or uniquely accessible from the set of digit lines 210 of another memory section 110-c.

The memory array 800 also includes a set of sense components (SC) 150-c (e.g., sense components 150-c-1 through 150-c-(s+1)) which may support various access operations on the memory sections 110-c. In the example of memory array 800, each of the memory sections 110-c may be associated with two of the sense components 150-c (e.g., an adjacent sense component 150-c on each illustrated side of a respective memory section), where the two sense components 150-c may provide a degree of redundancy for a particular memory section 110-c, or may operate in tandem (e.g., in cooperation, in a combined manner) to perform various operations with a particular memory section 110-c, or both.

The memory array 800 includes a row address buffer 810, which may indicate various addresses associated with access operations of the illustrated memory array. Each of the memory sections 110-c may include a respective section decoder 820-a (e.g., section decoders 820-a-1 through 820-a-s) that may generate an output signal (e.g., SecAct) based on whether or not the respective memory section 110-c is being accessed. For example, when an address associated with the memory section 110-c-1 is indicated in the signal RowAdd, the section decoder 820-a-1 may provide an activated SecAct1 signal, and when an address associated with the memory section 110-c-1 is not indicated in the signal RowAdd, the section decoder 820-a-1 may provide a deactivated SecAct1 signal. In some examples, a section decoder 820-a may be included in the associated row component 125-c.

Each of the row components 125-c may include one or more local VNWL controllers 450 (not shown), such as those described herein. Each of the row components 125-c may receive a respective SecAct signal (e.g., indicating whether an access operation is being performed on the associated memory section 110-c), and may provide or forward the respective SecAct signal to the one or more included local VNWL controllers 450. Thus, each of the one or more local VNWL controllers 450 of a row component 125-c may perform operations for selectively coupling or isolating word lines with voltage sources (e.g., a deselection or deactivation voltage source, a VNWL generator 410) based on an indication of whether an access operation is being performed on an associated memory section 110-c, such as the operations described with reference to the timing diagram 600 of FIG. 6.

In other words, the memory array 800 may perform the described coupling or isolation (e.g., between VNWL generators 410 of the row components 125-c and word drivers 440 of the row components 125-c) on a section-by-section basis (e.g., a first memory section 110-c performing a first instance of the described methods or operations, and a second memory section 110-c performing a second instance of the described methods or operations).

In some examples, the signal SecAct provided by a respective section decoder 820-a may also be provided to the sense components 150-c that are adjacent to the associated memory section 110-c, so that the sense components 150-c adjacent to a particular memory section 110-c may be activated or energized when the particular memory section 110-c is being accessed. In some examples, the memory array 800 illustrated by the block diagram may include a set of OR gates 830-a (e.g., OR gates 830-a-1 through 830-a-(s-1)) that receive the SecAct signal from two section decoders 820-a, so that a sense component 150-c that is between two memory sections 110-c may be activated or energized when either of the two memory sections 110-c is being accessed. For example, the OR gate 830-a-1 may provide an activated signal to the sense component 150-c-2 based on or when receiving either or both of an activated signal SecAct1 or an activated signal SecAct2.

Figure 9:
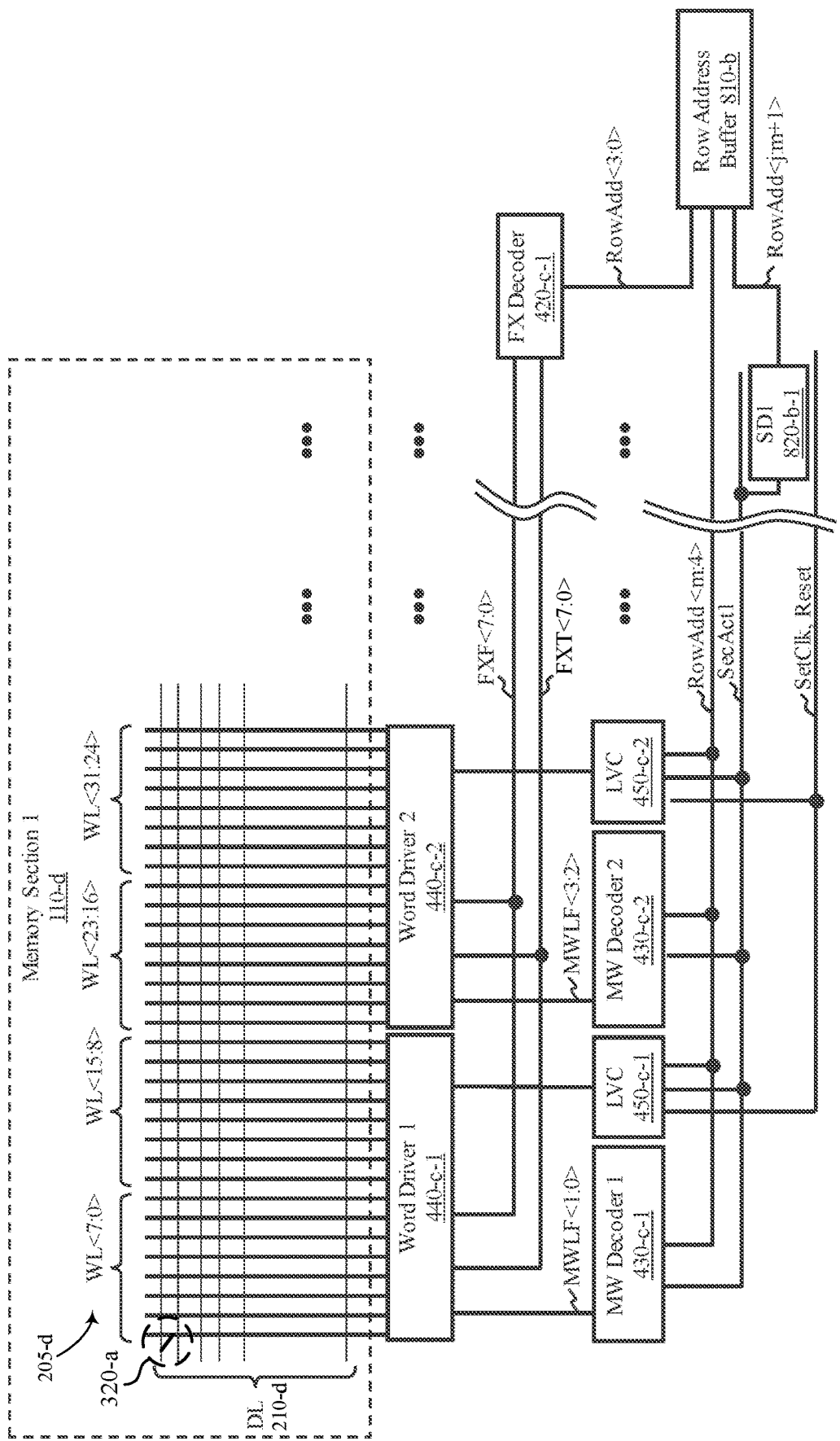
FIG. 9 shows a block diagram illustrating an arrangement of a memory array that may support access schemes for access line faults in a memory device in accordance with various embodiments of the present disclosure.

FIG. 9 shows a block diagram illustrating an arrangement of a memory array 900 that may support access schemes for access line faults in a memory device in accordance with various embodiments of the present disclosure. The memory array 900 may illustrate an arrangement of components that support identifying a memory section 110 that is associated with a particular access operation, and simultaneously performing the described operations for coupling and isolating voltage sources (e.g., deselection voltage sources) with different subsets of word lines 205 of the memory array (e.g., based on whether or not a particular subset of the word lines 205 includes a word line 205 associated with a fault).

The memory array 900 includes a memory section 110-d, which may be an example of a memory section 110 described herein (e.g., memory section 110-c-1 described with reference to FIG. 8). The memory section 110-d may include a set of memory cells 105 (not shown). For example, a respective one of the set of memory cells 105 may be located at the intersection of one of the word lines 205-d and one of the digit lines 210-d.

In the example of the memory section 110-d, each of the digit lines 210-d may intersect with each of the word lines 205-d. Further, each of the digit lines 210-d may be electrically isolated (e.g., non-conductive) from each of the digit lines 210 of another memory sections 110 in a memory device 100 that includes the memory section 110-d, and each of the word lines 205-d may be electrically isolated (e.g., non-conductive) from each of the word lines 205 of the other memory sections 110 of the memory device 100. In other words, the word lines 205-d of the memory section 110-d may be separately accessible from the word lines 205 of other memory sections 110 of the memory device, and the digit lines 210-d of the memory section 110-d may be separately accessible from the digit lines 210 of other memory sections 110 of the memory device.

The memory array 900 may include an FX decoder 420-c-1, a section decoder (SD) 820-b-1, a set of MW decoders 430-c, a set of word drivers 440, and a set of local VNWL controllers (LVC) 450-c. Each of these components may be located or otherwise operable with a row component 125 associated with the memory section 110-d. In various examples, any one or more of the FX decoder 420-c-1, the section decoder 820-b-1, the MW decoders 430-c, the word drivers 440-c, or the local VNWL controllers 450-c, or various combinations thereof, may be examples of or included in a memory controller 170 or a circuit configured to perform the described options for selectively coupling or decoupling a voltage source and an access line (e.g., a word line 205), which may be based at least in part on a detected fault 320 (e.g., fault 320 described with reference to FIG. 3, fault 320-a described with reference to FIG. 9).

The memory array 900 illustrates an example of groupings of word lines 205-d that may support an arrangement of FX decoders 420-c, section decoders 820-b, MW decoders 430-c, word drivers 440-c, and local VNWL controllers 450-c. In the example of memory array 900, the memory section 110-d is associated with (e.g., includes) a single FX decoder 420-c-1 and a single section decoder 820-b-1, but other examples of a memory section 110 may be associated with more than one FX decoder 420 or more than one section decoder 820. The memory section 110-d may also be associated with (e.g., include) 8 MW decoders 430-c, 8 word drivers 440-c, and 8 local VNWL controllers 450-c.

Thus, the memory section 110-d may be divided into a number of subsets (e.g., 8 subsets) according to a first grouping or division, where each of the components of the number of subsets according to the first grouping or division may be uniquely accessed or activated. In some examples, each of the subsets according the first grouping or division may simultaneously or concurrently perform separate instances of the described coupling or isolation (e.g., between VNWL generators 410 of the row components 125-c and word drivers 440 of the row components 125-c).

Each of the word drivers 440-c (e.g., each of the number of subsets according to the first grouping or division) may be associated with or coupled with a number of word lines 205-d (e.g., 16 word lines 205-d) that may be uniquely accessed or activated. In other words, the example the memory section 110-d may include 128 word lines 205-d that may be uniquely accessed or activated (e.g., according to a first grouping or division and according to a second grouping or division). Different numbers of subsets according to a first grouping or division and different numbers of subsets according to a second grouping or division may be used to support examples of access schemes for access line faults in a memory device described herein.

The memory array 900 includes a row address buffer 810-b, which may be an example of the row address buffer 810 described with reference to FIG. 8. In some examples, the row address buffer 810-b may be shared or common with other memory sections 110 (not shown) of a memory device 100 that includes the memory array 900. The row address buffer 810-b may indicate various addresses associated with access operations of the illustrated memory array 900.

For example, the row address buffer 810-b may receive (e.g., from a memory controller 170) instructions or control signals associated with access operations of a memory device 100, including addresses of particular rows (e.g., word lines 205-d) that are to be selected or activated to support the access operations. In the example of memory array 900, the row address buffer 810-b may provide different portions of a signal RowAdd (e.g., different grouping of bits, different sets of bits divided by bit significance, a subset of an address according to a first grouping or division of the memory section 110-d, a subset of an address according to a second grouping or division of the memory section, a subset according to sections) to different components of the memory array 900 for accessing particular word lines 205-d.

The section decoder 820-b-1 may generate an output signal (e.g., SecAct1) based on whether or not the memory section 110-d is being accessed. For example, when an address associated with the memory section 110-d is indicated in the signal RowAdd<j:m+1>, the section decoder 820-b-1 may provide an activated SecAct1 signal, and when an address associated with the memory section 110-d is not indicated in the signal RowAdd<j:m+1>, the section decoder 820-b-1 may provide a deactivated SecAct1 signal. Different portions of the signal RowAdd may be provided to different components of the memory array 900.

In one example, the signal RowAdd<3:0> may be provided to the FX decoder 420-c-1 for accessing word lines 205-d according to one grouping or division (e.g., a sub-word grouping or division). In the example of memory array 900, the FX decoder 420-c-1 may receive least-significant bits (LSB) (e.g., three bits) of the signal RowAdd and output separate bits (e.g., eight bits) or logical signals for each of the uniquely addressed sub-word-addresses (e.g., in signals FXT<7:0> and FXF<7:0>).

In another example, the signal RowAdd<m:4> may be provided to each of the MW decoders 430-c for accessing word lines 205-d according to another grouping or division (e.g., a main-word grouping or division). In the example of memory array 900, the MW decoders 430-c may receive more-significant bits than the FX Decoder 420-c-1, and output separate bits or logical signals for each of the uniquely addressed main-word-addresses (e.g., in signals MWLF<1:0>, MWLF<3:2>).

Thus, the FX decoder 420-c-1 and the MW decoders 430-c may provide signals or voltages to the word drivers 440-c for activating or deactivating particular word lines 205-d (e.g., according to main-word-addresses and sub-word-addresses), and may perform operations similar to those described with reference to the FX decoders 420 and the MW decoders 430 of FIGS. 4 and 7.

Each of the local VNWL controllers 450-c may receive the signal SecAct1 from the section decoder 820-b-1, indicating whether an access operation is being performed on the memory section 110-d (e.g., being performed with one or more of the word lines 205-d associated with the memory section 110-d). Thus, each of the local VNWL controllers 450-c of the memory array 900 may perform operations (e.g., simultaneously, concurrently) for selectively coupling or isolating different sets of word lines with voltage sources (e.g., a deselection or deactivation voltage source, a VNWL generator 410) based on an indication of whether an access operation is being performed on the associated memory section 110-d (e.g., signal SecAct1), such as the operations described with reference to the timing diagram 600 of FIG. 6. In other words, the memory array 900 (e.g., the memory section 110-d) may support the described coupling or isolation (e.g., between VNWL generators and the word drivers 440-c) on a subsection-by-subsection basis (e.g., a first instance of the described methods or operations being performed using a first of the local VNWL controllers 450-c, and a second instance of the described methods or operations being performed with a second of the local VNWL controllers 450-c).

In the example of memory array 900, the memory section 110-*d* includes a fault 320-*a* between a word line 205-*d* associated with the first subsection according to the first grouping or division (e.g., associated with the word driver 440-*c*-1, associated with the local VNWL controller 450-*c*-1) and a digit line 210-*d* of the memory section 110-*d*. In other words, the memory section 110-*d* may include a fault 320-*a* that is between a digit line 210-*d* that is common to each of the subsections according to the first grouping or division, and a word line 205-*d* that is a member of one of the subsections according to the first grouping or division. Thus, the local VNWL controller 450-*c*-1 may perform operations for selectively coupling and isolating a voltage source (e.g., a VNWL generator) with the word driver 440-*c*-1 or the word lines 205-*d* that are coupled with the word driver 440-*c*-1, which may be based on detecting or otherwise identifying that the fault 320-*a* is associated with the first subsection according to the first grouping or division. Further, the local VNWL controller 450-*c*-2 may not perform operations for selectively coupling and isolating a voltage source with the word driver 440-*c*-1 or the word lines 205-*d* that are coupled with the word driver 440-*c*-1, but instead may maintain such a coupling with a voltage source (e.g., between the word driver 440-*c*-2 and a VNWL generator) throughout the operation of the memory array 900, which may be based on detecting or otherwise identifying that the second subsection according to the first grouping or division does not include a fault 320.

Thus, the memory array 900 may be an example of a configuration that supports isolating a first word line (e.g., the word lines 205-*d* associated with the fault 320-*a* and associated with the word driver 440-*c*-1) of a section of a memory device from a voltage source during a first portion of a period when the first word line is deselected, determining that an access operation associated with a second word line (e.g., any of the other word lines 205-*d*, based on the signal SecAct1) of the section of the memory device is performed during a second portion of the period when the first word line is deselected, and coupling the first word line with the voltage source during the second portion of the period when the first word line is deselected based at least in part on determining that the access operation associated with the second word line is performed during the second portion of the period when the first word line is deselected.

The memory array 900 may also be an example of a configuration that supports isolating a third word line (e.g., another of the word lines associated with the word driver 440-*c*-1, which may not be associated with the fault 320-*a*) of the section of the memory device from the voltage source during the first portion of the period when the first word line is deselected (e.g., simultaneously or concurrently with isolating the first word line from the voltage source), and coupling the third word line with the voltage source during the second portion of the period when the first word line is deselected based at least in part on determining that the access operation associated with the second word line of is being performed (e.g., simultaneously or concurrently with coupling the first word line with the voltage source).

The memory array 900 may also be an example of a configuration that supports identifying that that a fourth word line (e.g., any of the word lines 205-*d* associated with the word driver 440-*c*-2, which is not associated with a fault) of the section of the memory device is not associated with a fault, and coupling the fourth word line of the section of the memory device with the voltage source (e.g., a VNWL generator that is common to the memory section 110-*d*, a VNWL generator that is common to the memory device 100 that includes the memory section 110-*d*) during the first portion and the second portion of the period when the first word line is deselected based at least in part on identifying that the fourth word line is not associated with the fault. In other words, because the word driver 440-*c*-2 does not include a word line 205-*d* that is associated with a fault, the local VNWL controller 450-*c*-2 may maintain a connection between the word driver 440-*c*-2 and a VNWL generator throughout the operation of the memory array 900, or at least until a fault 320 is identified with a word line 205-*d* that is coupled with the word driver 440-*c*-2.

Figure 10:
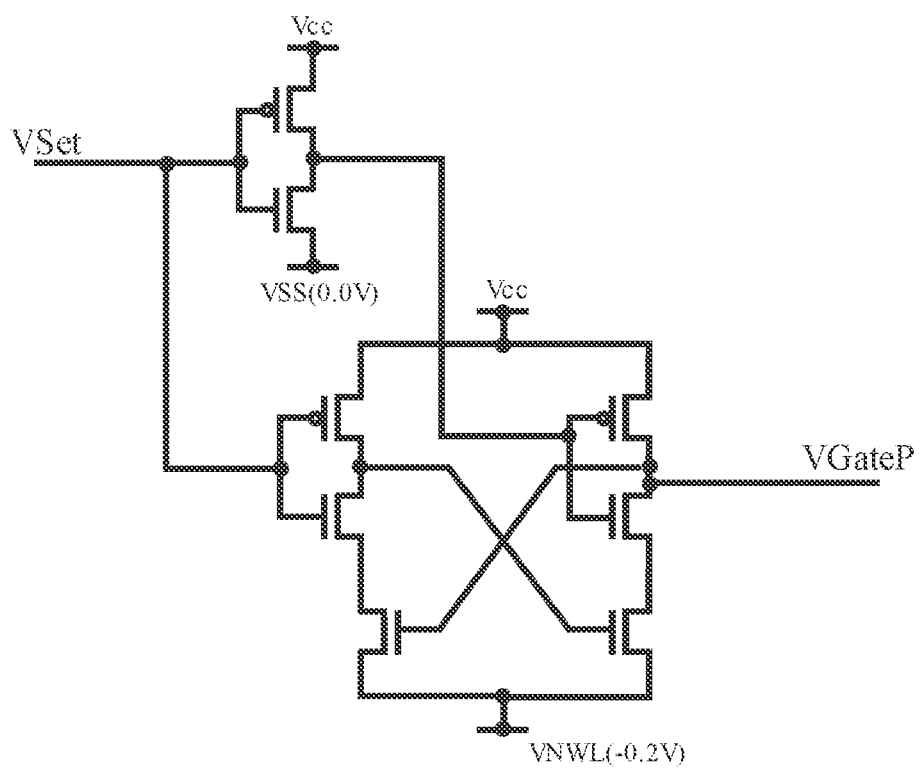
FIG. 10 illustrates an example circuit that supports access schemes for access line faults in a memory device in accordance with examples of the present disclosure.

FIG. 10 illustrates an example circuit 1000 that supports access schemes for access line faults in a memory device in accordance with examples of the present disclosure. The circuit 1000 may be an example of or be included in a voltage level shifter, such as the voltage level shifter 550 (e.g., as included in the local VNWL controller 450-*b*) described with reference to FIG. 5.

The circuit 1000 may receive (e.g., as an input) a signal VSet, which in some examples may be a logical signal. When implemented in a local VNWL controller 450 (e.g., local VNWL controller 450-*b*), the signal VSet may be received from a NOR gate (e.g., NOR gate 540 described with reference to FIG. 5), where such a NOR gate may determine whether a memory section 110 is being accessed and whether a memory address of the memory section 110 is associated with a fault (e.g., a fault 320 as described with reference to FIG. 3).

The circuit 1000 may be an example of a circuit or a component that shifts a voltage level of a logical state. For example, when the circuit receives the signal VSet with a deselected or deactivated logical state (e.g., a voltage of Vss, or 0V, in the example of the local VNWL controller 450-*a*), the circuit may output the signal VGateP (e.g., a logical output signal) with a voltage of VNWL (e.g., −0.2V). In other words, the circuit 1000 may shift the voltage level of a deselected or deactivated logical state (e.g., from the input VSet to the output VGateP) from 0V to −0.2V.

The circuit 1000 may also be an example of a circuit or a component that maintains a voltage level of a logical state. For example, when the circuit 1000 receives the signal VSet with a selected or activated logical state (e.g., a voltage Vcc, or 1.6V, in the example of the local VNWL controller 450-*a*), the circuit 1000 may output the signal VGateP with a voltage of Vcc (e.g., 1.6V). In other words, the circuit 1000 may not shift the voltage level of a selected or activated logical state (e.g., from the input VSet to the output VGateP), and instead may maintain the voltage of the logical signal at Vcc.

Thus, the circuit 1000 may be an example of a circuit or component that shifts a voltage or bias level of one logical state, and maintains a voltage or bias level of a different logical state.

Figure 11:
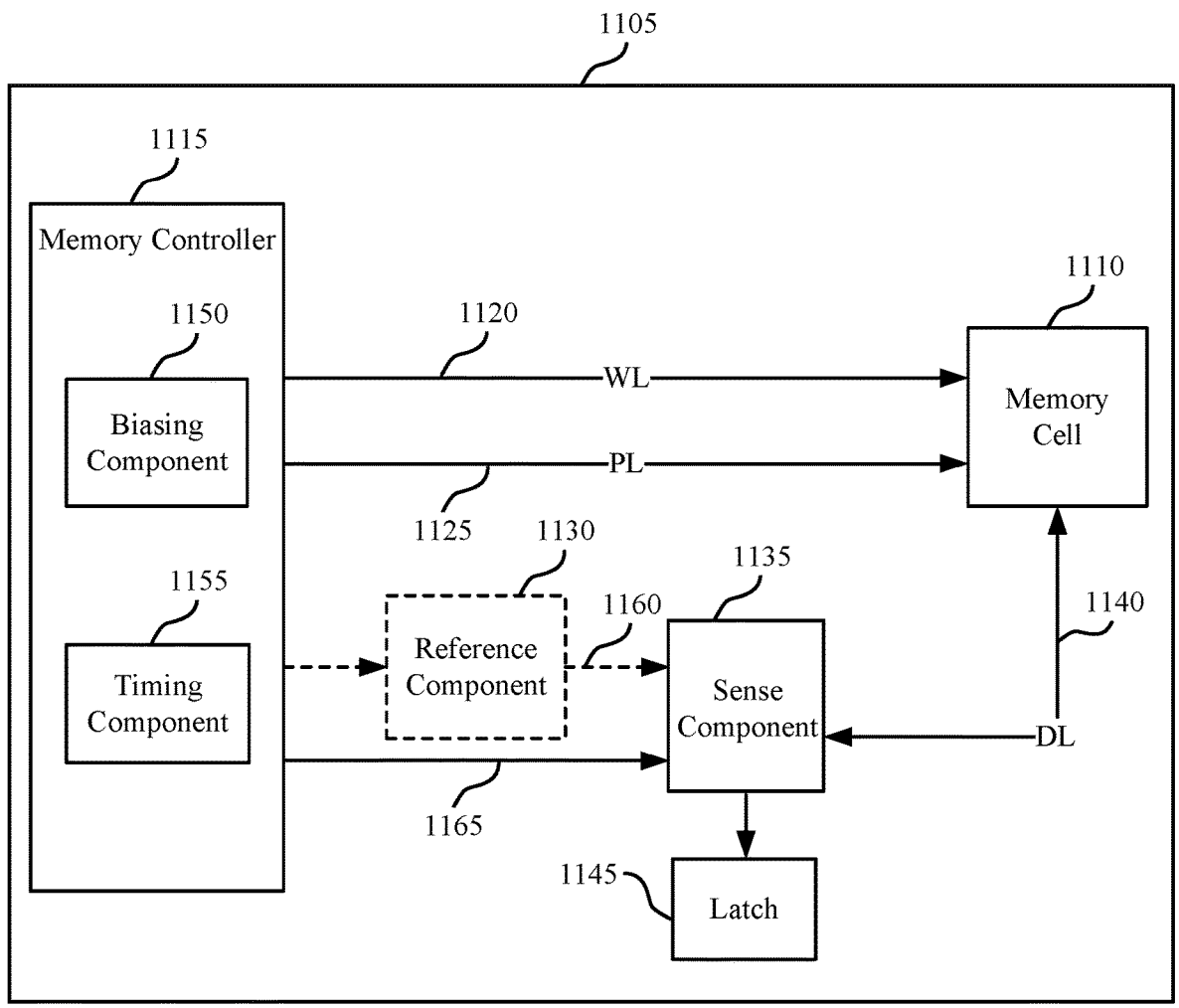
FIG. 11 shows a block diagram of a memory device that may support access schemes for access line faults in accordance with various embodiments of the present disclosure.

FIG. 11 shows a block diagram 1100 of a memory device 1105 that may support access schemes for access line faults in accordance with various embodiments of the present disclosure. The memory device 1105 may be referred to as an electronic memory apparatus, and may be an example of a component of a memory device 100 as described with reference to FIG. 1.

The memory device 1105 may include one or more memory cells, which may be an example of memory cells 105 (e.g., of a memory section 110) described with reference to FIGS. 1 through 11. The memory device 1105 may also include a memory controller 1115, a word line 1120, a plate line 1125, a sense component 1135, and a digit line 1140. These components may be in electronic communication with each other and may perform one or more of the functions described herein. In some cases, the memory controller 1115 may include a biasing component 1150 and a timing component 1155.

The memory controller 1115 may be in electronic communication with the word line 1120, the plate line 1125, the digit line 1140, and the sense component 1135, which may be examples of a word line 205, a plate line 215, a digit line 210, and a sense component 150 described with reference to FIGS. 1 through 11. In some examples, the memory device 1105 may also include a latch 1145, which may be an example of an I/O component 160 as described herein. The components of the memory device 1105 may be in electronic communication with each other and may perform embodiments of the functions described with reference to FIGS. 1 through 11. In some cases, the sense component 1135 or latch 1145 may be components of memory controller 1115.

In some examples, the digit line 1140 may be in electronic communication with the sense component 1135 (e.g., via a signal development component 280, via a bypass line 270, as described herein) and a capacitor or ferroelectric capacitor of a memory cell 1110. A memory cell 1110 may be writable with a logic state (e.g., a first or second logic state). The word line 1120 may be in electronic communication with the memory controller 1115 (e.g., a row decoder of the memory controller 1115) and a cell selection component of a memory cell 1110 (e.g., a switching component, a transistor). The plate line 1125 may be in electronic communication with the memory controller 1115 and a plate of the capacitor or ferroelectric capacitor of a memory cell 1110. The sense component 1135 may be in electronic communication with the memory controller 1115, the digit line 1140, and the latch 1145. In some examples, a common access line may provide the functions of a signal line and a reference line. The sense control line 1165 may be in electronic communication with the sense component 1135 and the memory controller 1115. These components may also be in electronic communication with other components, inside, or outside, or both of the memory device 1105, in addition to components not listed above, via other components, connections, or busses.

The memory controller 1115 may be an example of a memory controller 170 as described herein, and may be configured to activate the word line 1120, the plate line 1125, or the digit line 1140 by applying voltages to various nodes. For example, the biasing component 1150 may be configured to apply a voltage to operate the memory cell 1110 to read or write the memory cell 1110 as described above. In some examples, the memory controller 1115 may include one or more of a row component 115, a column component 135, or a plate component 145, or may otherwise perform one or more operations described with reference to row components 125, column components 135, or plate components 145, or may otherwise communicate with a row component 125, a column component 135, a plate component 145, or a combination thereof, as described with reference to FIGS. 1 through 11, which may enable the memory controller 1115 to access one or more memory cells 1110. The biasing component 1150 may provide voltages (e.g., voltage sources) for coupling with the memory cell 1110. Additionally or alternatively, the biasing component 1150 may provide voltages (e.g., voltage sources) for the operation of the sense component 1135 or the reference component 1130.

In some cases, the memory controller 1115 may perform one or more of its operations using the timing component 1155. For example, the timing component 1155 may control the timing of the various word line selections or plate biasing, including timing for switching and voltage application to perform the memory functions, such as reading and writing, discussed herein (e.g., in accordance with operations described with reference to timing diagram 600 of FIG. 6). In some cases, the timing component 1155 may control the operations of the biasing component 1150. In some cases, the timing component 1155 may include a timer associated with memory sections 110 of the memory device 1105.

The sense component 1135 may compare a sense signal from the memory cell 1110 (e.g., via digit line 1140) with a reference signal (e.g., from the reference component 1130 via a reference line 1160, from the memory cell 1110). Upon determining the logic state, the sense component 1135 may then store the output in the latch 1145, where it may be used in accordance with the operations of an electronic device that may include the memory device 1105. The sense component 1135 may include one or more amplifiers in electronic communication with the latch and the ferroelectric memory cell.

The memory controller 1115, or its sub-components, may be implemented in hardware, code (e.g., software, firmware) executed by a processor, or any combination thereof. If implemented in code executed by a processor, the functions of the memory controller 1115, or its sub-components, may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The memory controller 1115, or its sub-components, may be physically located at various positions, including being distributed such that portions of functions are implemented at different physical locations by one or more physical devices. In some examples, the memory controller 1115, or its sub-components, may be a separate and distinct component in accordance with various embodiments of the present disclosure. In other examples, the memory controller 1115, or its sub-components, may be combined with one or more other hardware components, including but not limited to an I/O component, a transceiver, a network server, another computing device, one or more other components described in the present disclosure, or a combination thereof in accordance with various embodiments of the present disclosure. The memory controller 1115 may be an example of the memory controller 1215 described with reference to FIG. 12 or the memory controller 1315 described with reference to FIG. 13.

In some examples, the memory controller 1115, including any subcomponents thereof, may support the described examples of access schemes for access line faults in the memory device 1105. For example, the memory device 1105 may include a plurality of memory cells 1110 coupled with the digit line 1140 and the plate line 1125. In some examples, each of the plurality of memory cells 1110 may include a cell selection component configured to selectively couple the respective one of the plurality of memory cells with the digit line 1140. The memory device may include a plurality of word lines 1120, each coupled with the cell selection component of the respective one of the plurality of memory cells. The memory device 1105 may also include a row decoder coupled with each of the plurality of word lines, which may be included in the memory controller 1115, or may be a separate component in communication with the memory controller 1115.

In accordance with embodiments of the present disclosure, the memory controller 1115 may be operable to perform the described access schemes for access line faults, which may include selectively coupling or isolating a voltage source with one or more word lines 1120 (e.g., during a period when one of the word lines 1120 is deselected). In some examples, the memory controller 1115 may be operable to isolate a first word line 1120 from a voltage source during a first period of a standby state of the first word line, determine that an access operation associated with the second word line is being performed during a second period of the standby state, couple the first word line with the voltage source during the second period of the standby state for the first word line based at least in part on determining that the access operation associated with the second word line is being performed.

Figure 12:
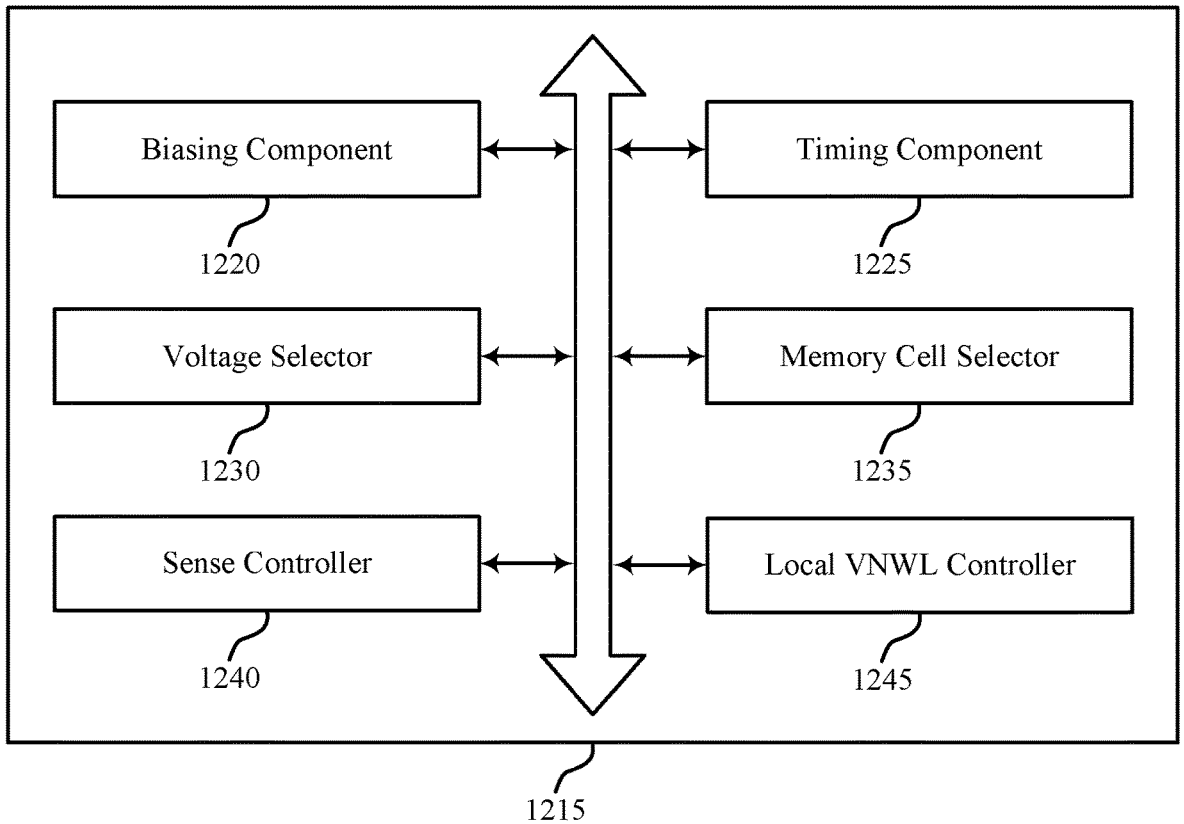
FIG. 12 shows a block diagram of a memory controller that may support access schemes for access line faults in a memory device in accordance with various embodiments of the present disclosure.

FIG. 12 shows a block diagram 1200 of a memory controller 1215 that may support access schemes for access line faults in a memory device in accordance with various embodiments of the present disclosure. The memory controller 1215 may be an example of a memory controller 170 described with reference to FIG. 1 or a memory controller 1115 described with reference to FIG. 11. The memory controller 1215 may include a biasing component 1220 and a timing component 1225, which may be examples of biasing component 1150 and timing component 1155 described with reference to FIG. 11. The memory controller 1215 may also include a voltage selector 1230, a memory cell selector 1235, a sense controller 1240, and a local VNWL controller 1245, which may be an example of the local VNWL controllers 450 described herein. Each of these modules may communicate, directly or indirectly, with one another (e.g., via one or more buses).

The voltage selector 1230 may initiate the selection of voltage sources to support various access operations of a memory device. For example, the voltage selector 1230 may generate or trigger control signals used to activate or deactivate various switching components or voltage sources, such as the control signals provided to the local VNWL controllers 450 described with reference to FIGS. 4-11, or control signals that may be provided to row components 125, plate components 145, sense components 150, or reference components 285-*a* as described with reference to FIGS. 1 through 11. For example, the voltage selector 1230 may generate one or more of the logical signals for selecting (e.g., enabling, disabling) the voltages of word lines 205, digit lines 210, or plate lines 215 as illustrated in timing diagram 600 of FIG. 6. In some examples the voltage selector 1230 may be an example of a voltage level shifter 550 described with reference to FIG. 5.

The memory cell selector 1235 may select a memory cell for access operations (e.g., read operations, write operations, rewrite operations, refresh operations, and others). In some examples, the memory cell selector 1235 may generate logical signals used to activate or deactivate a memory section 110 of a memory device. In some examples, the memory cell selector 1235 may generate logical signals or address signals used to activate or deactivate a cell selection component, such as cell selection components 230 described herein. In some examples, the memory cell selector 1235 may initiate or otherwise control the word line voltages $V_{WL}$ illustrated in timing diagram 600 of FIG. 6.

The sense controller 1240 may control various operations of a sense component, such as the sense components 150 described herein. For example, the sense controller 1240 may generate logical signals (e.g., isolation signals) used to activate or deactivate a sense component isolation component, such as the switching components between a sense component 150 and a memory section 110 or reference component 285 described with reference to FIG. 3. In some examples, the sense controller 1240 may generate logical signals (e.g., equalization signals) used to equalize nodes of a sense component 150 or of an access line. In some examples, the sense controller 1240 may generate logical signals used to couple or decouple a sense component with a sensing voltage source, or to couple or decouple a sense component with an input/output component 160 or a latch 1145. Thus, in some examples, the sense controller 1240 may generate the logical signals described with reference to timing diagram 600 of FIG. 6.

In some embodiments, the sense controller 1240 may compare a voltage of a first node of a sense amplifier with a voltage of a second node of a sense amplifier, where the voltages are based on (e.g., result from) accessing the memory cell with one or more access operations of a read operation. The sense controller 1240 may determine a logic value associated with the memory cell based on comparing the resultant voltages. In some examples, the sense controller 1240 may provide signals to another component to determine the logic value associated with the memory cell.

Figure 13:
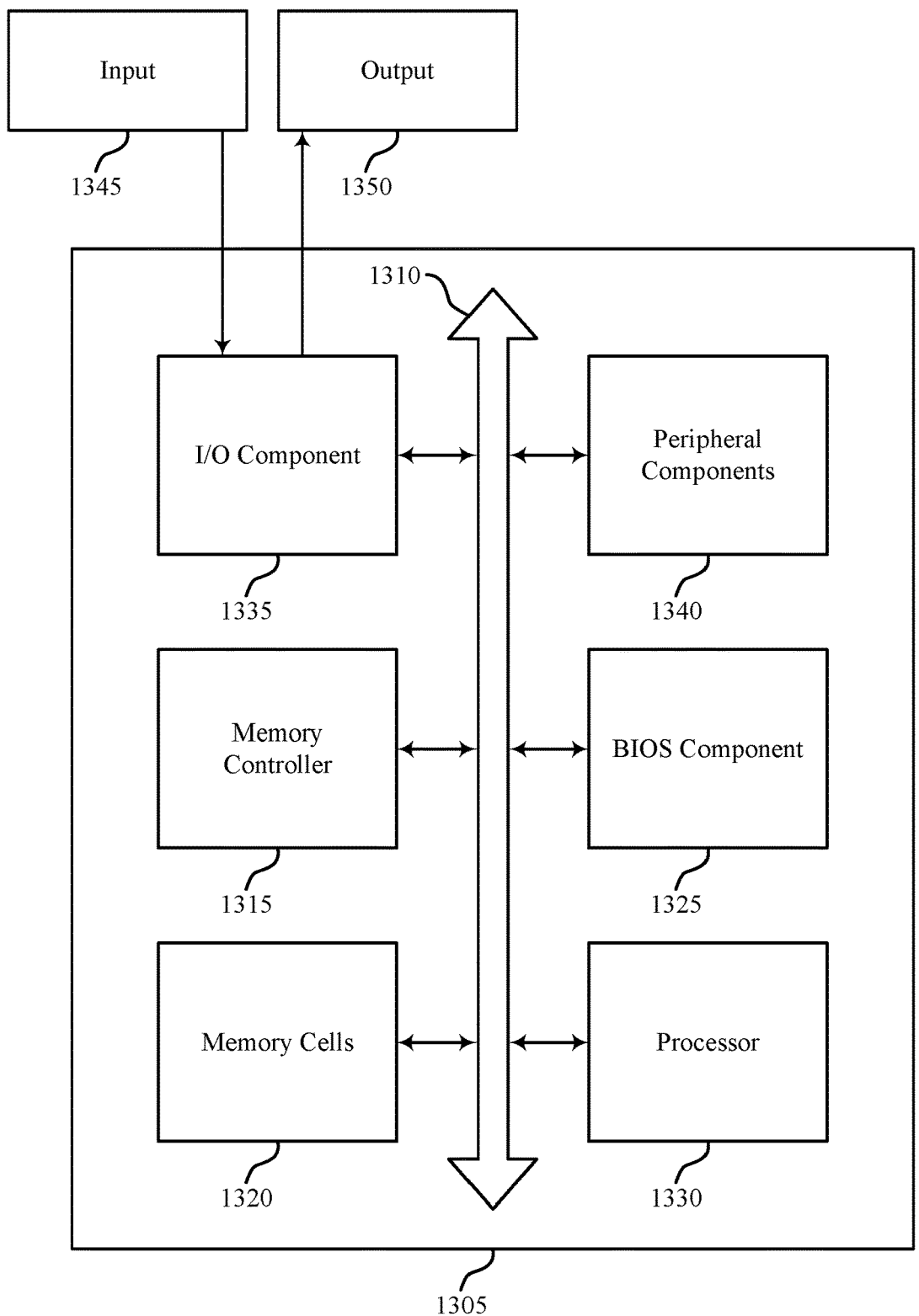
FIG. 13 shows a diagram of a system including a device that may support access schemes for access line faults in a memory device in accordance with various embodiments of the present disclosure.

FIG. 13 shows a diagram of a system 1300 including a device 1305 that may support access schemes for access line faults in a memory device in accordance with various embodiments of the present disclosure. The device 1305 may be an example of or include the components of memory device 100 as described above, for example, with reference to FIG. 1. The device 1305 may include components for bi-directional communications including components for transmitting and receiving communications, including a memory controller 1315, memory cells 1320, a basic input/output system (BIOS) component 1325, a processor 1330, an I/O component 1335, and peripheral components 1340. These components may be in electronic communication via one or more busses (e.g., bus 1310).

The memory controller 1315 may operate one or more memory cells as described herein. Specifically, the memory controller 1315 may be configured to support the described sensing schemes for accessing memory cells, or performing access schemes for access line faults. In some cases, the memory controller 1315 may include a row component, a column component, a plate component, or a combination thereof, as described with reference to FIGS. 1 through 5.

The memory cells 1320 may be an example of memory cells 105 or 1110 described with reference to FIGS. 1 through 11, and may store information (e.g., in the form of a logic state) as described herein.

The BIOS component 1325 be a software component that includes BIOS operated as firmware, which may initialize and run various hardware components. The BIOS component 1325 may also manage data flow between a processor and various other components, such as peripheral components, I/O control components, and others. The BIOS component 1325 may include a program or software stored in read only memory (ROM), flash memory, or any other non-volatile memory.

The processor 1330 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1330 may be configured to operate a memory array using a memory controller. In other cases, a memory controller may be integrated into the processor 1330. The processor 1330 may be configured to execute computer-readable instructions stored in a memory to perform various functions (e.g., functions or tasks supporting access schemes for access line faults in a memory device).

The I/O component 1335 may manage input and output signals for the device 1305. The I/O component 1335 may also manage peripherals not integrated into the device 1305. In some cases, the I/O component 1335 may represent a physical connection or port to an external peripheral. In some cases, the I/O component 1335 may utilize an operating system such as iOS®, ANDROID®, MS-DOS®, MS-WINDOWS®, OS/2®, UNIX®, LINUX®, or another known operating system. In other cases, the I/O component 1335 may represent or interact with a modem, a keyboard, a mouse, a touchscreen, or a similar device. In some cases, the I/O component 1335 may be implemented as part of a processor. In some cases, a user may interact with the device 1305 via the I/O component 1335 or via hardware components controlled by the I/O component 1335. The I/O component 1335 may support accessing the memory cells 1320, including receiving information associated with the sensed logic state of one or more of the memory cells 1320, or providing information associated with writing a logic state of one or more of the memory cells 1320.

The peripheral components 1340 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1345 may represent a device or signal external to the device 1305 that provides input to the device 1305 or its components. This may include a user interface or an interface with or between other devices. In some cases, the input 1345 may be managed by the I/O component 1335, and may interact with the device 1305 via a peripheral component 1340.

The output 1350 may represent a device or signal external to the device 1305 configured to receive output from the device 1305 or any of its components. Examples of the output 1350 may include a display, audio speakers, a printing device, another processor or printed circuit board, or other devices. In some cases, the output 1350 may be a peripheral element that interfaces with the device 1305 via the peripheral component(s) 1340. In some cases, the output 1350 may be managed by the I/O component 1335.

The components of the device 1305 may include circuitry designed to carry out their functions. This may include various circuit elements, for example, conductive lines, transistors, capacitors, inductors, resistors, amplifiers, or other active or inactive elements, configured to carry out the functions described herein. The device 1305 may be a computer, a server, a laptop computer, a notebook computer, a tablet computer, a mobile phone, a wearable electronic device, a personal electronic device, or the like. Or the device 1305 may be a portion or element of such a device.

Figure 14:
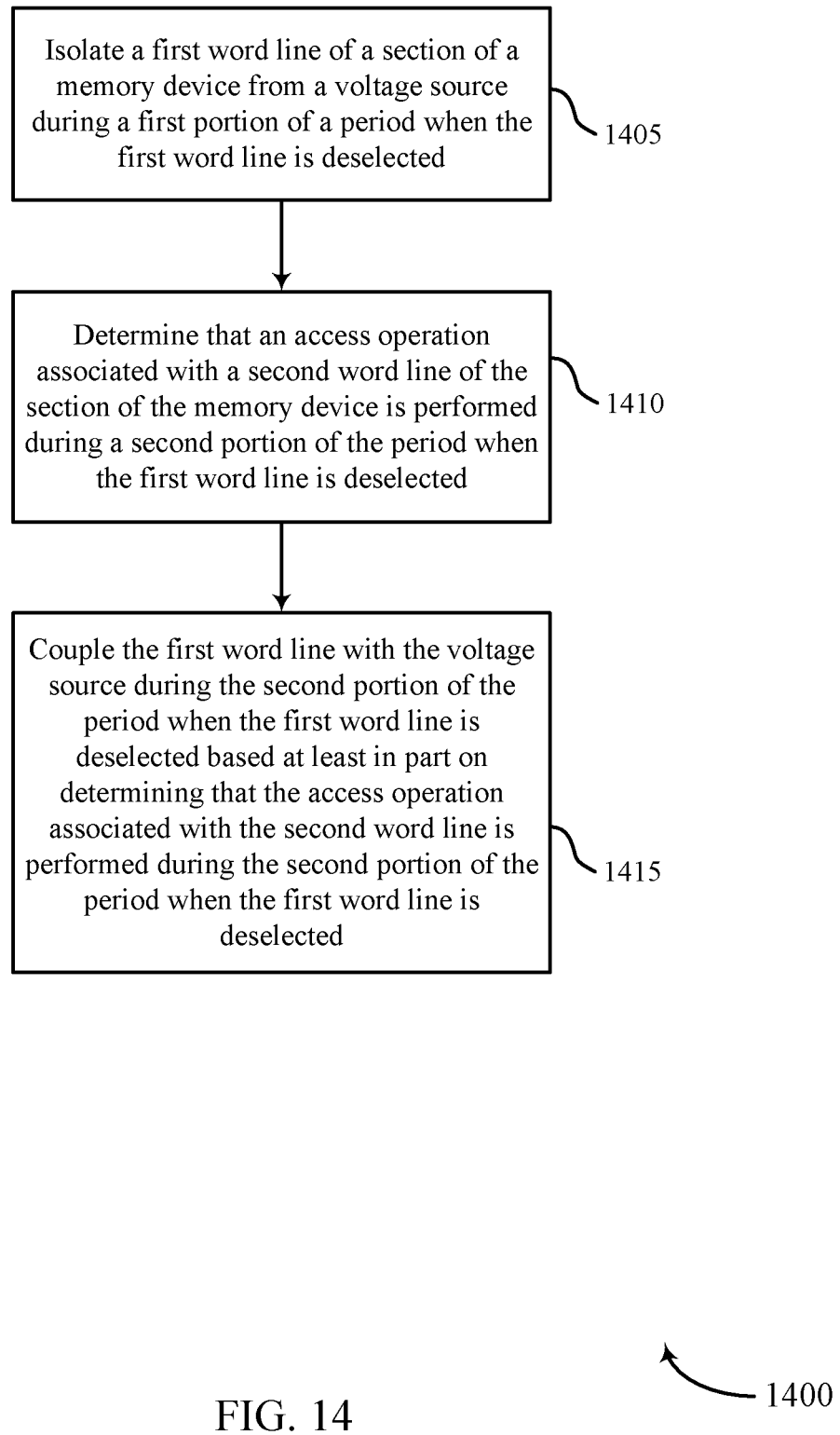
FIGS. 14 and 15 show flowcharts illustrating methods that may support access schemes for access line faults in a memory device in accordance with various embodiments of the present disclosure.

FIG. 14 shows a flowchart illustrating a method 1400 that may support access schemes for access line faults in a memory device in accordance with various embodiments of the present disclosure. The operations of the method 1400 may be performed according to the methods and apparatuses described with reference to FIGS. 1 through 13. In some examples, the operations of method 1400 may be implemented by one or more components illustrated in a memory device 100, a circuit 200, a circuit 300, a circuit 400, a local VNWL controller 450, a circuit 700, a memory array 800, a memory array 900, a memory device 1105, a system 1300, or their components as described herein. For example, operations of method 1400 may be performed at least in part by a memory controller or a local VNWL controller as described with reference to FIGS. 1 through 13. In some examples, a memory device may execute a set of instructions to control the functional elements of the device (e.g., voltage supplies, logical signals, transistors, amplifiers, switching components, selection components) to perform the functions described below. Additionally or alternatively, the memory device may perform some or all of the functions described below using special-purpose hardware.

At 1405 the method 1400 may include isolating a first word line of a section of a memory device from a voltage source during a first portion of a period when the first word line is deselected.

At 1410 the method 1400 may include determining that an access operation associated with a second word line of the section of the memory device is performed during a second portion of the period when the first word line is deselected.

At 1415 the method 1400 may include coupling the first word line with the voltage source during the second portion of the period when the first word line is deselected based at least in part on determining that the access operation associated with the second word line is performed during the second portion of the period when the first word line is deselected.

Some examples of the method 1400 may further include identifying that the first word line of the section of the memory device is associated with a fault, and isolating the first word line may be based on identifying that the first word line of the section of the memory device is associated with the fault. In some examples, identifying that the first word line of the section of the memory device is associated with the fault includes identifying a presence of short circuit fault between the first word line of the section and a digit line of the section. In some examples, identifying that the first word line of the section of the memory device is associated with the fault includes receiving an indication of memory addresses having short circuit faults, and determining that the first word line is indicated in the received information, and isolating the first word line may be based on determining that the first word line is indicated in the received information. Some examples may further include latching a value of the determination that the first word line is indicated in the received information.

Some examples of the method 1400 may further include deselecting the first word line based on identifying that the first word line of the section of the memory device is associated with the fault, and isolating the first word line may be based at least in part on deselecting the first word line.

In some examples of the method 1400, isolating the first word line from the voltage source may include activating a switching component between the voltage source and the first word line.

Some examples of the method 1400 may further include determining that the access operation associated with the second word line is complete, and isolating the first word line of the section from the voltage source during a third portion of the period when the first word line is deselected based on determining that the access operation associated with the second word line is complete Some examples of the method 1400 may further include biasing the first word line with a negative voltage based at least in part on coupling the first word line with the voltage source Some examples of the method 1400 may further include isolating a third word line of the section of the memory device from the voltage source during the first portion of the period when the first word line is deselected, and coupling the third word line with the voltage source during the second portion of the period when the first word line is deselected based on determining that the access operation associated with the second word line of is being performed.

Some examples of the method 1400 may further include identifying that that a fourth word line of the section of the memory device is not associated with a fault, and coupling the fourth word line of the section of the memory device with the voltage source during the first portion and the second portion of the period when the first word line is deselected based on identifying that the fourth word line is not associated with the fault.

Figure 15:
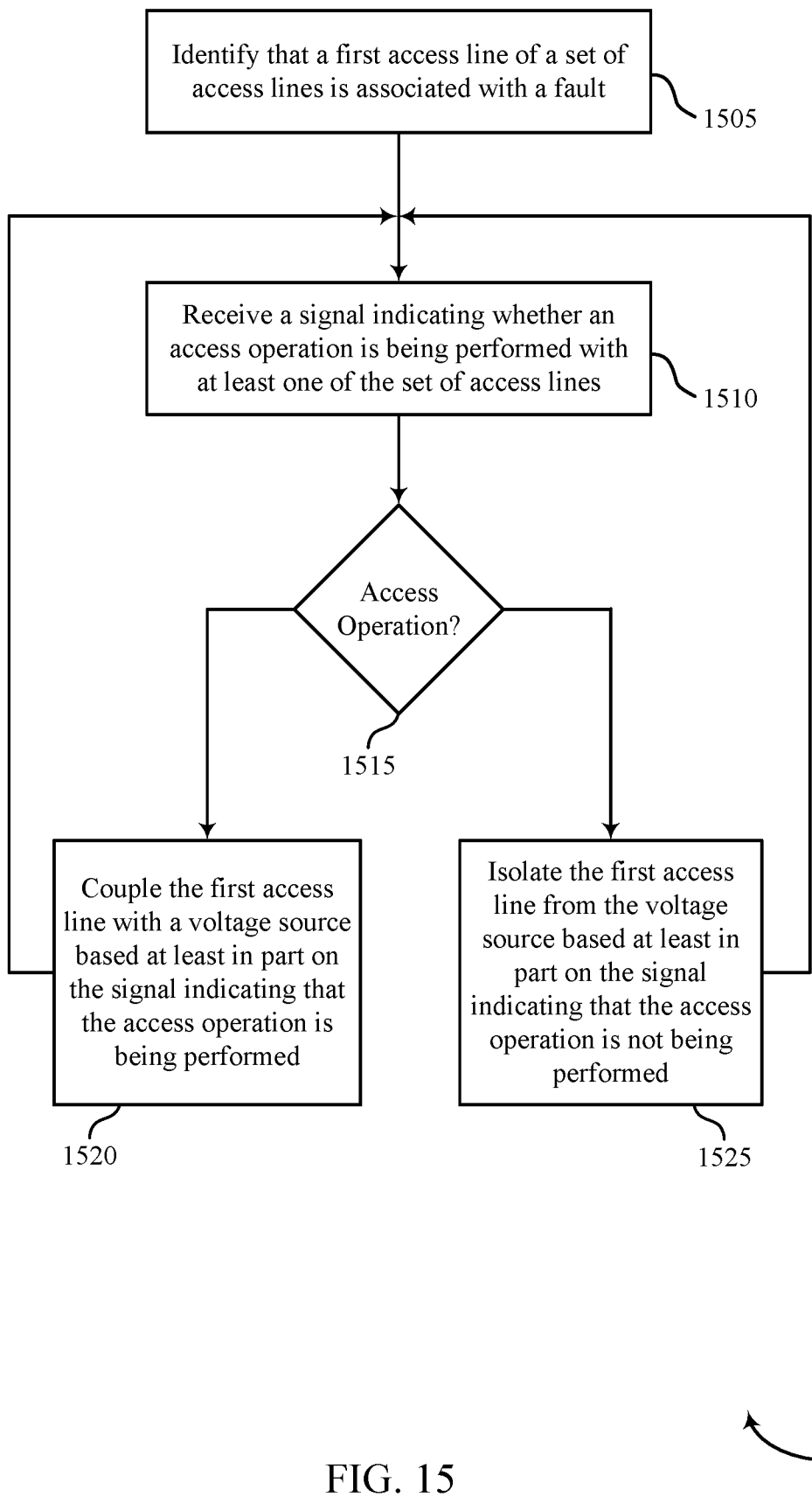

FIG. 15 shows a flowchart illustrating a method 1500 that may support access schemes for access line faults in a memory device in accordance with various embodiments of the present disclosure. The operations of the method 1500 may be performed according to the methods and apparatuses described with reference to FIGS. 1 through 13. In some examples, the operations of method 1500 may be implemented by one or more components illustrated in a memory device 100, a circuit 200, a circuit 300, a circuit 400, a local VNWL controller 450, a circuit 700, a memory array 800, a memory array 900, a memory device 1105, a system 1300, or their components as described herein. For example, operations of method 1500 may be performed at least in part by a memory controller or a local VNWL controller as described with reference to FIGS. 1 through 13. In some examples, a memory device may execute a set of instructions to control the functional elements of the device (e.g., voltage supplies, logical signals, transistors, amplifiers, switching components, selection components) to perform the functions described below. Additionally or alternatively, the memory device may perform some or all of the functions described below using special-purpose hardware.

At 1505, the method 1500 may include identifying that a first access line of a set of access lines is associated with a fault. In some examples identifying that the first access line is associated with a fault may include operating a volatile latch configured to store a comparison of an address of the first access line with a second signal indicating memory addresses associated with faults At 1510, the method 1500 may include receiving a signal indicating whether an access operation is being performed with at least one of the set of access lines.

At 1515, the method 1500 may include identifying whether an access operation is being performed with at least one of the set of access lines. When the signal indicates that an access operation is being performed with at least one of the set of access lines, the method 1500 may proceed to 1520. When the signal indicates that an access operation is not being performed with at least one of the set of access lines, the method 1500 may proceed to 1525.

At 1520, the method 1500 may include coupling the first access line with a voltage source based at least in part on the signal indicating that the access operation is being performed with at least one of the set of access lines. In some examples, coupling the first access line with the voltage source may include activating a switching component between the first access line and the voltage source. In some examples, the method may further include coupling a second access line with the voltage source based at least in part on the signal indicating that the access operation is being performed with at least one of the set of access lines. After 1520, the method 1500 may return to 1515.

At 1525, the method 1500 may include isolating the first access line from the voltage source based at least in part on the signal indicating that the access operation is not being performed with at least one of the set of access lines. In some examples, isolating the first access line from the voltage source may include deactivating a switching component between the first access line and the voltage source. In some examples, the method may further include isolating a second access line of the set of access lines from the voltage source based at least in part on the signal indicating that the access operation is not being performed with at least one of the set of access lines. After 1520, the method 1500 may return to 1515.

In some examples, the method 1500 may further include identifying whether a third access line of the set of access lines is associated with a second fault, and coupling the third access line with the voltage source based at least in part on identifying whether the third access line is associated with the second fault.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a deenergized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

As used herein, the term "terminal" need not suggest a physical boundary or connection point of a circuit element. Rather, "terminal" may refer to a reference point of a circuit relevant to the circuit element, which may also be referred to as a "node" or "reference point."

As used herein, the term "layer" may refer to a stratum or sheet of a geometrical structure. each layer may have three dimensions (e.g., height, width, and depth) and may cover some or all of a surface. For example, a layer may be a three-dimensional structure where two dimensions are greater than a third, such as a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, such as, transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory device 100, circuit 200, and circuit 400, described with reference to FIGS. 1, 2, and 4, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

decoupling a first word line from a first voltage to isolate the first word line from a source of the first voltage during a first portion of a period when the first word line is deselected, wherein the first word line reaches a second voltage associated with a digit line based at least in part on a current flowing between the first word line and the digit line in response to decoupling the first word line from the first voltage that comprises a negative voltage;

determining that an access operation associated with a second word line is performed during a second portion of the period when the first word line is deselected; and coupling the first word line with the first voltage during the second portion of the period when the first word line is deselected based at least in part on determining that the access operation associated with the second word line is performed during the second portion of the period when the first word line is deselected.

2. The method of claim 1, further comprising:

receiving a signal indicating whether the access operation is being performed with at least the second word line, wherein decoupling the first word line is based at least in part on receiving the signal.

3. The method of claim 1, further comprising:

identifying that the first word line is associated with a fault, wherein decoupling the first word line is based at least in part on identifying the first word line is associated with the fault.

4. The method of claim 3, wherein identifying that the first word line is associated with the fault comprises:

identifying a presence of short circuit fault between the first word line and the digit line.

5. The method of claim 1, further comprising:

deselecting the first word line based at least in part on identifying that the first word line is associated with a fault, wherein decoupling the first word line is based at least in part on deselecting the first word line.

6. The method of claim 3, wherein identifying that the first word line is associated with the fault comprises:
receiving an indication of memory addresses having short circuit faults; and
determining that the first word line is indicated in the received indication, wherein decoupling the first word line is based at least in part on determining that the first word line is indicated in the received indication.

7. The method of claim 6, further comprising:
latching a value in response to determining that the first word line is indicated in the received indication.

8. The method of claim 1, wherein decoupling the first word line from the first voltage comprises:
deactivating a switching component between the first voltage and the first word line.

9. The method of claim 1, further comprising:
determining that the access operation associated with the second word line is complete; and
decoupling the first word line from the first voltage during a third portion of the period when the first word line is deselected based at least in part on determining that the access operation associated with the second word line is complete.

10. The method of claim 1, further comprising:
biasing the first word line with the negative voltage based at least in part on coupling the first word line with the first voltage.

11. The method of claim 1, further comprising:
identifying that a third word line of a section of a memory device that includes the first word line and the second word line is not associated with a fault; and
coupling the third word line of the section of the memory device with the first voltage during the first portion and the second portion of the period when the first word line is deselected based at least in part on identifying that the third word line is not associated with the fault.

12. An apparatus comprising:
memory cells;
digit lines;
a first word line and a second word line each configured to selectively couple a respective portion of the memory cells with a respective portion of the digit lines; and
a controller operable to:
decouple the first word line from a first voltage to isolate the first word line from a source of the first voltage during a first period of a standby state of the first word line, the standby state corresponding to a state in which the memory cells are not accessed using the first word line, wherein the first word line reaches a second voltage associated with a digit line based at least in part on a current flowing between the first word line and the digit line in response to decoupling the first word line from the first voltage that comprises a negative voltage;
determine that an access operation associated with the second word line is performed during a second period of the standby state; and
couple the first word line with the first voltage during the second period of the standby state for the first word line based at least in part on determining that the access operation associated with the second word line is being performed.

13. The apparatus of claim 12, wherein the controller is further operable to:
identify a fault associated with the first word line; and
initiate the standby state for the first word line based at least in part on identifying the fault associated with the first word line.

14. The apparatus of claim 12, wherein the controller is further operable to:
identify a fault associated with the first word line; and
decouple the first word line from the first voltage during the first period of the standby state based at least in part on identifying the fault associated with the first word line.

15. The apparatus of claim 12, wherein, to decouple the first word line from the first voltage, the controller is further operable to:
deactivate a switching component between the first voltage and the first word line.

16. The apparatus of claim 12, wherein the controller is further operable to:
bias the first word line with the negative voltage based at least in part on coupling the first word line with the first voltage.

17. The apparatus of claim 12, wherein the controller is further operable to:
decouple a third word line from the first voltage during the first period of the standby state; and
couple the third word line with the first voltage during the second period of the standby state based at least in part on determining that the access operation is being performed.

18. The apparatus of claim 12, wherein the controller is further operable to:
identify that a fourth word line is not associated with a fault; and
couple the fourth word line with the first voltage during the first period and the second period of the standby state based at least in part on identifying that the fourth word line is not associated with the fault.

19. The apparatus of claim 12, wherein the controller is further operable to:
receive a signal indicating whether the access operation is being performed with at least one word line of a section of a memory device that includes the first word line and the second word line.

20. An apparatus comprising:
memory cells;
a set of access lines comprising a first access line and a second access line, the first access line configured to activate cell selection components associated with a set of the memory cells and the second access line configured to activate cell selection components associated with a different set of the memory cells; and
a circuit configured to:
receive a signal indicating whether an access operation is being performed with at least the second access line; and
couple the first access line with a voltage source associated with a first voltage based at least in part on the signal indicating that the access operation is being performed; or
decouple the first access line from the voltage source associated with the first voltage to isolate the first access line based at least in part on the signal indicating that the access operation is not being performed, wherein the first access line reaches a second voltage associated with a digit line based at least in part on a current flowing between the first access line and the digit line in response to decoupling the first access line from the voltage source associated with the first voltage that comprises a negative voltage.

* * * * *